(12) United States Patent
Yogeeswaran et al.

(10) Patent No.: US 10,459,012 B2
(45) Date of Patent: Oct. 29, 2019

(54) SYSTEM FOR MONITORING ELECTRICAL POWER USAGE OF A STRUCTURE AND METHOD OF SAME

(71) Applicant: Belkin International, Inc., Playa Vista, CA (US)

(72) Inventors: Karthik Yogeeswaran, Santa Monica, CA (US); Francis Kelly, Thousand Oaks, CA (US); Shwetak N. Patel, Seattle, WA (US); Sidhant Gupta, Seattle, WA (US); Matthew S. Reynolds, Seattle, WA (US)

(73) Assignee: BELKIN INTERNATIONAL, INC., Playa Vista, CA (US)

( * ) Notice: Subject to any disclaimer, the term of this patent is extended or adjusted under 35 U.S.C. 154(b) by 0 days.

(21) Appl. No.: 15/966,779

(22) Filed: Apr. 30, 2018

(65) Prior Publication Data
US 2018/0252751 A1 Sep. 6, 2018

Related U.S. Application Data

(62) Division of application No. 14/635,824, filed on Mar. 2, 2015, now abandoned, which is a division of
(Continued)

(51) Int. Cl.
*G01R 19/00* (2006.01)
*G01R 15/20* (2006.01)
(Continued)

(52) U.S. Cl.
CPC ........... *G01R 19/0092* (2013.01); *G01R 1/20* (2013.01); *G01R 15/202* (2013.01);
(Continued)

(58) Field of Classification Search
CPC .............. G01R 35/005; G01R 19/0092; G01R 31/3191
See application file for complete search history.

(56) References Cited

U.S. PATENT DOCUMENTS

| | | | |
|---|---|---|---|
| 3,714,516 A | 1/1973 | Howe | |
| 4,012,734 A | 3/1977 | Jagoda et al. | |

(Continued)

FOREIGN PATENT DOCUMENTS

| | | |
|---|---|---|
| AR | 070667 | 4/2010 |
| CA | 2705528 | 5/2009 |

(Continued)

OTHER PUBLICATIONS

Ho, B., Kao, H.C., Chen, N., et al. HeatProbe: A Thermal-based Power Meter for Accounting Disaggregated Electricity Usage. In UbiComp 2011.

(Continued)

*Primary Examiner* — Noam Reisner
(74) *Attorney, Agent, or Firm* — Bryan Cave Leighton Paisner LLP

(57) ABSTRACT

Some embodiments include a method for monitoring usage of electrical power of a structure using an electrical power monitoring system. The structure can have one or more main electrical power lines that supply the electrical power to a first load in the structure. The method can include calibrating the electrical power monitoring system. A first raw current in the one or more main electrical power lines and first calibration data can be generated while calibrating the electrical power monitoring system. The method also can include storing the first calibration data and a measurement of the first raw current. The method additionally can include measuring a second raw current. The method further can include calculating a first measured current. The method additionally can include displaying the first measured cur- (Continued)

rent. Other embodiments of related systems and methods are disclosed.

20 Claims, 22 Drawing Sheets

Related U.S. Application Data application No. 13/175,774, filed on Jul. 1, 2011, now Pat. No. 8,972,211.

(60) Provisional application No. 61/361,296, filed on Jul. 2, 2010, provisional application No. 61/380,174, filed on Sep. 3, 2010.

(51) Int. Cl.
| | |
|---|---|
| G01R 35/00 | (2006.01) |
| G01R 35/04 | (2006.01) |
| G01R 33/07 | (2006.01) |
| G01R 33/09 | (2006.01) |
| G01R 31/327 | (2006.01) |
| G01R 1/20 | (2006.01) |
| G01R 21/00 | (2006.01) |
| G01R 21/06 | (2006.01) |
| G01R 22/06 | (2006.01) |

(52) U.S. Cl.
CPC ......... *G01R 15/207* (2013.01); *G01R 31/327* (2013.01); *G01R 33/07* (2013.01); *G01R 33/09* (2013.01); *G01R 35/005* (2013.01); *G01R 35/007* (2013.01); *G01R 35/04* (2013.01); *G01R 21/001* (2013.01); *G01R 21/06* (2013.01); *G01R 22/06* (2013.01); *G01R 22/063* (2013.01)

(56) References Cited

U.S. PATENT DOCUMENTS

| | | | |
|---|---|---|---|
| 4,612,617 A | 9/1986 | Laplace, Jr. et al. |
| 4,638,417 A | 1/1987 | Martin et al. |
| 4,706,073 A | 11/1987 | Vila Masot |
| 4,716,409 A | 12/1987 | Hart et al. |
| 4,804,957 A | 2/1989 | Selph et al. |
| 4,858,141 A | 8/1989 | Hart et al. |
| 4,891,587 A | 1/1990 | Squire |
| 5,177,560 A | 1/1993 | Stimple et al. |
| 5,229,753 A | 7/1993 | Berg et al. |
| 5,233,342 A | 8/1993 | Yashiro et al. |
| 5,268,666 A | 12/1993 | Michel et al. |
| 5,276,629 A | 1/1994 | Reynolds |
| 5,409,037 A | 4/1995 | Wheeler et al. |
| 5,428,342 A | 6/1995 | Enoki et al. |
| 5,441,070 A | 8/1995 | Thompson |
| 5,467,011 A | 11/1995 | Hunt |
| 5,483,153 A | 1/1996 | Leeb et al. |
| 5,483,838 A | 1/1996 | Holden |
| 5,495,168 A | 2/1996 | de Vries |
| 5,534,663 A | 7/1996 | Rivers et al. |
| 5,590,179 A | 12/1996 | Shincovich et al. |
| 5,600,310 A | 2/1997 | Whipple et al. |
| 5,635,895 A | 6/1997 | Murr |
| 5,650,771 A | 7/1997 | Lee |
| 5,699,276 A | 12/1997 | Roos |
| 5,717,325 A | 2/1998 | Leeb et al. |
| 5,808,846 A | 9/1998 | Holce et al. |
| 5,880,677 A | 3/1999 | Lestician |
| 5,898,387 A | 4/1999 | Davis et al. |
| 5,929,315 A | 7/1999 | Dunegan |
| 6,094,043 A | 7/2000 | Scott et al. |
| 6,137,283 A | 10/2000 | Williams et al. |
| 6,147,484 A | 11/2000 | Smith |
| 6,173,613 B1 | 1/2001 | Dunegan |
| 6,273,686 B1 | 8/2001 | Kroell et al. |
| 6,275,168 B1 | 8/2001 | Slater et al. |
| 6,310,470 B1 | 10/2001 | Hebing et al. |
| 6,320,968 B1 | 11/2001 | Linder |
| 6,330,516 B1 | 12/2001 | Kammeter |
| 6,418,083 B1 | 7/2002 | Wagstaff et al. |
| 6,420,969 B1 | 7/2002 | Campbell |
| 6,614,211 B1 | 9/2003 | Douglas |
| 6,622,097 B2 | 9/2003 | Hunter |
| 6,678,209 B1 | 1/2004 | Peng et al. |
| 6,708,126 B2 | 3/2004 | Culler et al. |
| 6,728,646 B2 | 4/2004 | Howell et al. |
| 6,734,806 B1 | 5/2004 | Cratsley |
| 6,771,078 B1 | 8/2004 | McCauley et al. |
| 6,816,078 B2 | 11/2004 | Onoda et al. |
| 6,839,644 B1 | 1/2005 | Woods et al. |
| 6,853,291 B1 | 2/2005 | Aisa |
| 6,860,288 B2 | 3/2005 | Uhler |
| 6,906,617 B1 | 6/2005 | Van de Meulen |
| 6,910,025 B2 | 6/2005 | Cao |
| 6,949,921 B1 | 9/2005 | Feight et al. |
| 6,993,417 B2 | 1/2006 | Osann, Jr. |
| 7,019,666 B2 | 3/2006 | Tootoonian Mashhad et al. |
| 7,043,380 B2 | 5/2006 | Rodenberg et al. |
| 7,049,976 B2 | 5/2006 | Hunt et al. |
| 7,078,996 B1 | 7/2006 | Cern et al. |
| 7,133,729 B1 | 7/2006 | Wang et al. |
| 7,119,533 B2 | 10/2006 | Tamura et al. |
| 7,134,568 B2 | 11/2006 | Moriyama et al. |
| 7,174,260 B2 | 2/2007 | Tuff et al. |
| 7,183,669 B2 | 2/2007 | Schripsema et al. |
| 7,265,531 B2 | 9/2007 | Stauth et al. |
| 7,276,915 B1 | 10/2007 | Euler et al. |
| 7,298,133 B2 | 11/2007 | Hastings et al. |
| 7,330,796 B2 | 2/2008 | Addink et al. |
| 7,400,986 B2 | 7/2008 | Latham et al. |
| 7,417,558 B2 | 8/2008 | Lightbody et al. |
| 7,460,930 B1 | 12/2008 | Howell et al. |
| 7,493,221 B2 | 2/2009 | Caggiano et al. |
| 7,498,935 B2 | 3/2009 | Kodama et al. |
| 7,508,318 B2 | 3/2009 | Casella et al. |
| 7,511,229 B2 | 3/2009 | Vlasak et al. |
| 7,541,941 B2 | 6/2009 | Bogolea et al. |
| 7,546,214 B2 | 6/2009 | Rivers, Jr. et al. |
| 7,589,942 B2 | 9/2009 | Kumfer et al. |
| 7,612,971 B2 | 11/2009 | Premerlani et al. |
| 7,656,649 B2 | 2/2010 | Loy et al. |
| 7,692,555 B2 | 4/2010 | Stanley et al. |
| 7,693,670 B2 | 4/2010 | Durling et al. |
| 7,702,421 B2 | 4/2010 | Sullivan et al. |
| 7,705,484 B2 | 4/2010 | Horst |
| 7,706,928 B1 | 4/2010 | Howell et al. |
| 7,719,257 B2 | 5/2010 | Robarge et al. |
| 7,728,986 B2 | 6/2010 | Lasker et al. |
| 7,729,993 B2 | 6/2010 | Baraty |
| 7,747,357 B2 | 6/2010 | Murdoch |
| 7,755,347 B1 | 7/2010 | Cullen et al. |
| 7,795,877 B2 | 9/2010 | Radtke et al. |
| 7,804,280 B2 | 9/2010 | Deaver, Sr. et al. |
| 7,855,655 B2 | 12/2010 | Hunter et al. |
| 7,885,917 B2 | 2/2011 | Kuhns et al. |
| 7,889,061 B2 | 2/2011 | Endo |
| 7,912,530 B2 | 3/2011 | Seki et al. |
| 7,982,596 B2 | 7/2011 | Curt et al. |
| 7,996,171 B2 | 8/2011 | Banhegyesi |
| 8,049,488 B2 | 11/2011 | Dempster et al. |
| 8,065,099 B2 | 11/2011 | Gibala et al. |
| 8,078,431 B2 | 12/2011 | Brown |
| 8,093,765 B1 | 1/2012 | Beard |
| 8,094,034 B2 | 1/2012 | Patel et al. |
| 8,140,414 B2 | 3/2012 | O'Neil et al. |
| 8,195,423 B2 | 6/2012 | Von Zon |
| 8,325,817 B2 | 12/2012 | Iwami et al. |
| 8,334,784 B2 | 12/2012 | Patel et al. |
| 8,344,724 B2 | 1/2013 | Leeb et al. |
| 8,378,845 B2 | 2/2013 | Reymann et al. |
| 8,392,107 B2 | 3/2013 | Patel et al. |
| 8,463,452 B2 | 6/2013 | Masters et al. |
| 8,494,762 B2 | 7/2013 | Patel et al. |

(56) References Cited

U.S. PATENT DOCUMENTS

| | | |
|---|---|---|
| 8,659,286 B2 | 2/2014 | Reynolds |
| 8,664,564 B2 | 3/2014 | Vogel |
| 8,712,732 B2 | 4/2014 | Patel et al. |
| 8,924,604 B2 | 12/2014 | Yogeeswaran et al. |
| 8,930,152 B2 | 1/2015 | Patel et al. |
| 9,766,277 B2 | 9/2017 | Patel et al. |
| 9,857,449 B2 * | 1/2018 | Maguire .............. G01R 35/005 |
| 2001/0003286 A1 | 6/2001 | Philippbar et al. |
| 2002/0010690 A1 | 1/2002 | Howell et al. |
| 2002/0036492 A1 | 3/2002 | Slater et al. |
| 2003/0050737 A1 | 3/2003 | Osann et al. |
| 2003/0088374 A1 | 5/2003 | Slater et al. |
| 2003/0088527 A1 | 5/2003 | Hung et al. |
| 2003/0097348 A1 | 5/2003 | Cao |
| 2003/0112370 A1 | 6/2003 | Long et al. |
| 2003/0151406 A1 | 8/2003 | Wan et al. |
| 2003/0158677 A1 | 8/2003 | Swarztrauber et al. |
| 2003/0184280 A1 | 10/2003 | Bowman et al. |
| 2003/0193405 A1 | 10/2003 | Hunt et al. |
| 2003/0216877 A1 | 11/2003 | Culler et al. |
| 2004/0027138 A1 | 2/2004 | Pickerd et al. |
| 2004/0128034 A1 | 7/2004 | Lenker et al. |
| 2004/0140908 A1 | 7/2004 | Gladwin et al. |
| 2004/0196024 A1 | 10/2004 | Stauth et al. |
| 2004/0206405 A1 | 10/2004 | Smith et al. |
| 2004/0229578 A1 | 11/2004 | Lightbody et al. |
| 2004/0251897 A1 | 12/2004 | Pedersen |
| 2005/0001486 A1 | 1/2005 | Schripsema et al. |
| 2005/0060107 A1 | 3/2005 | Rodenberg, III et al. |
| 2005/0067049 A1 | 3/2005 | Fima et al. |
| 2006/0009928 A1 | 1/2006 | Addink et al. |
| 2006/0049831 A1 | 3/2006 | Anwar |
| 2006/0050447 A1 | 3/2006 | Pellon et al. |
| 2006/0077046 A1 | 4/2006 | Endo |
| 2006/0103549 A1 | 5/2006 | Hunt et al. |
| 2006/0195275 A1 | 8/2006 | Latham et al. |
| 2006/0220833 A1 | 10/2006 | Berkman |
| 2006/0226958 A1 | 10/2006 | Baril et al. |
| 2006/0245467 A1 | 11/2006 | Casella et al. |
| 2006/0259201 A1 | 11/2006 | Brown |
| 2006/0259254 A1 | 11/2006 | Swarztrauber et al. |
| 2006/0284613 A1 | 12/2006 | Hastings et al. |
| 2007/0014369 A1 | 1/2007 | Santhoff et al. |
| 2007/0064377 A1 | 3/2007 | DeBoer et al. |
| 2007/0067003 A1 | 3/2007 | Sanchez et al. |
| 2007/0085534 A1 | 4/2007 | Seki et al. |
| 2007/0114987 A1 | 5/2007 | Kagan |
| 2007/0132458 A1 | 6/2007 | Allen |
| 2007/0152864 A1 | 7/2007 | Pease |
| 2007/0230094 A1 | 10/2007 | Carlson |
| 2007/0237441 A1 | 10/2007 | Roussell et al. |
| 2008/0030075 A1 | 2/2008 | Stanley et al. |
| 2008/0042636 A1 | 2/2008 | Koste et al. |
| 2008/0079437 A1 | 4/2008 | Robarge et al. |
| 2008/0082276 A1 | 4/2008 | Rivers et al. |
| 2008/0086394 A1 | 4/2008 | O'Neil et al. |
| 2008/0091345 A1 | 4/2008 | Patel et al. |
| 2008/0106241 A1 | 5/2008 | Deaver et al. |
| 2008/0167755 A1 | 7/2008 | Curt |
| 2008/0172192 A1 * | 7/2008 | Banhegyesi ........... G01R 22/10 702/61 |
| 2008/0224892 A1 | 9/2008 | Bogolea et al. |
| 2008/0234983 A1 | 9/2008 | Leigh et al. |
| 2008/0255782 A1 | 10/2008 | Bilac et al. |
| 2008/0308254 A1 | 12/2008 | Premerlani et al. |
| 2009/0043520 A1 | 2/2009 | Pollack et al. |
| 2009/0045804 A1 | 2/2009 | Durling et al. |
| 2009/0070058 A1 | 3/2009 | Lin |
| 2009/0072985 A1 | 3/2009 | Patel et al. |
| 2009/0115620 A1 | 5/2009 | Hunter et al. |
| 2009/0224754 A1 | 9/2009 | Lamarre et al. |
| 2009/0240449 A1 | 9/2009 | Gibala et al. |
| 2009/0312968 A1 | 12/2009 | Phillips |
| 2010/0030393 A1 | 2/2010 | Masters et al. |
| 2010/0049456 A1 | 2/2010 | Dempster et al. |
| 2010/0070214 A1 | 3/2010 | Hyde et al. |
| 2010/0070218 A1 | 3/2010 | Hyde et al. |
| 2010/0088057 A1 | 4/2010 | Kopaczewski et al. |
| 2010/0109842 A1 | 5/2010 | Patel et al. |
| 2010/0148579 A1 | 6/2010 | Maloney |
| 2010/0188262 A1 | 7/2010 | Reymann et al. |
| 2010/0219808 A1 | 9/2010 | Steckley et al. |
| 2010/0264731 A1 | 10/2010 | Arimilli et al. |
| 2010/0280392 A1 | 11/2010 | Liu et al. |
| 2011/0004421 A1 | 1/2011 | Rosewell et al. |
| 2011/0037444 A1 | 2/2011 | Wildash |
| 2011/0043374 A1 | 2/2011 | Bannister |
| 2011/0050218 A1 | 3/2011 | Lohss |
| 2011/0074382 A1 | 3/2011 | Patel |
| 2011/0098949 A1 | 4/2011 | Vennelakanti et al. |
| 2011/0112780 A1 | 5/2011 | Moss |
| 2011/0194705 A1 | 8/2011 | Gautama |
| 2011/0218746 A1 | 9/2011 | Joo |
| 2011/0249181 A1 | 10/2011 | Iwami et al. |
| 2012/0001617 A1 | 1/2012 | Reynolds |
| 2012/0041696 A1 | 2/2012 | Sanderford, Jr. et al. |
| 2012/0068692 A1 | 3/2012 | Patel et al. |
| 2012/0072143 A1 | 3/2012 | Yogeeswaran et al. |
| 2012/0072389 A1 | 3/2012 | Aldridge et al. |
| 2012/0092142 A1 | 4/2012 | Patel et al. |
| 2012/0215410 A1 | 8/2012 | McClure |
| 2012/0293146 A1 | 11/2012 | Zhao |
| 2013/0119972 A1 | 5/2013 | Maguire et al. |
| 2013/0179124 A1 | 7/2013 | Patel et al. |
| 2015/0002137 A1 | 1/2015 | Patel et al. |
| 2015/0168464 A1 | 6/2015 | Yogeeswaran et al. |
| 2016/0154043 A1 | 6/2016 | Patel et al. |
| 2016/0202340 A1 | 7/2016 | Maguire et al. |

FOREIGN PATENT DOCUMENTS

| | | |
|---|---|---|
| CN | 1379860 | 11/2002 |
| CN | 1495432 | 5/2004 |
| CN | 1509410 | 6/2004 |
| CN | 20121017 | 3/2009 |
| CN | 101523226 | 9/2009 |
| CN | 101535819 | 9/2009 |
| CN | 101562074 | 10/2009 |
| CN | 101632292 | 1/2010 |
| CN | 101680676 | 3/2010 |
| DE | 102007032053 | 1/2009 |
| EP | 200312 | 11/1986 |
| EP | 1136829 | 9/2001 |
| EP | 1444527 | 4/2004 |
| EP | 2171363 | 4/2010 |
| EP | 2174395 | 4/2010 |
| EP | 2188879 | 5/2010 |
| FR | 2645968 | 10/1990 |
| FR | 2680875 | 3/1993 |
| GB | 2228337 | 8/1990 |
| GB | 2235304 | 2/1991 |
| GB | 2461915 | 1/2010 |
| GB | 2465800 | 2/2010 |
| GB | 2464634 | 4/2010 |
| GB | 2464927 | 5/2010 |
| GB | 2465367 | 5/2010 |
| JP | 2001190506 | 7/1989 |
| JP | 02212780 | 8/1990 |
| JP | 04050786 | 2/1992 |
| JP | 2004296663 | 10/1992 |
| JP | 2006062512 | 3/1994 |
| JP | 07012976 | 3/1995 |
| JP | 09130961 | 5/1997 |
| JP | 2009130961 | 5/1997 |
| JP | 10282161 | 10/1998 |
| JP | 2000258482 | 9/2000 |
| JP | 2001103622 | 4/2001 |
| JP | 2004132790 | 4/2004 |
| JP | 2004219365 | 8/2004 |
| JP | 2005195427 | 7/2005 |
| JP | 2008122083 | 8/2006 |
| JP | 2007107972 | 4/2007 |
| JP | 2010112936 | 5/2010 |
| KR | 1019960024384 | 7/1996 |

(56) References Cited

FOREIGN PATENT DOCUMENTS

| KR | 1019980069423 | 10/1998 |
|---|---|---|
| KR | 1020040087036 | 10/2004 |
| KR | 20080114143 | 12/2008 |
| KR | 20090057058 | 6/2009 |
| KR | 20090057071 | 6/2009 |
| KR | 2010021458 | 2/2010 |
| KR | 1020100032534 | 3/2010 |
| KR | 20100021604 | 8/2011 |
| KR | 101318982 | 10/2013 |
| RU | 2200364 | 3/2003 |
| RU | 2402023 | 10/2010 |
| WO | 93004377 | 3/1993 |
| WO | 2001050142 | 7/2001 |
| WO | 200300003029 | 1/2003 |
| WO | 20080042483 | 4/2008 |
| WO | 2008150458 | 12/2008 |
| WO | 20080153576 | 12/2008 |
| WO | 20080153577 | 12/2008 |
| WO | 20090040140 | 4/2009 |
| WO | 20090063397 | 5/2009 |
| WO | 2009081407 | 7/2009 |
| WO | 2010007369 | 1/2010 |
| WO | 20100062398 | 6/2010 |
| WO | 2011035301 | 3/2011 |
| WO | 2011057049 | 5/2011 |
| WO | 2011104661 | 9/2011 |
| WO | 2012003426 | 1/2012 |
| WO | 2016040883 | 3/2016 |

OTHER PUBLICATIONS

HomePlug Powerline Alliance, web.archive.org/web/20060225110208/www.homeplug.org/en/products/index.asp, 2006, 1 page.
Horst, Gale., "Whirlpool Corporation: Woodridge Energy Study and Monitoring Pilot." 1-99, 2006.
Howell, E.K., "How Switches Produce Electrical Noise," IEEE Transactions on Electromagnetic Compatibility, Aug. 1979, pp. 162-170, vol. EMC-21, No. 3.
Iachello et al., "Privacy and Proportionality: Adapting Legal Evaluation Techniques to Inform Design in Ubiquitous Computing." CHI 2005: 91-100, 2005.
International Search Report and Written Opinion for PCT/US12/57224 dated Mar. 8, 2013.
International Search Report and Written Opinion for PCT/US2011/042877, dated Dec. 26, 2011, ten (10) pages.
International Search Report and Written Opinion for PCT/US2011/042873, dated Dec. 27, 2011, ten (10) pages.
International Search Report and Written Opinion for PCT/US11/033992, dated Dec. 26, 2011.
International Search Report and Written Opinion for PCT/US2011/043410, dated Feb. 28, 2011, ten (10) pages.
Intille, S.S., Tapia, E.M., Rondoni, J., Beaudin, J., Kukla, C., Agarwal, S., Bao, L, and Larson, K., "Tools for Studying Behavior and Technology in Natural Settings," In the Proceedings of UbiComp 2003, 2003.
Kawahara, Y., Hodges, S., Cook, B.S., and Abowd, G.D. Instant Inkjet Circuits: Lab-based Inkjet Printing to Support Rapid Prototyping of UbiComp Devices. In UbiComp 2013, 363-372, 2013.
Kientz et al., "The Georgia Tech Aware Home." CHI 2008: 3675-3680,2008.
Kim, Y., Schmid, T., Charbiwala, Z.M., and Srivastava, M.B., "ViridiScope: Design and Implementation of a Fine Grained Power Monitoring System for Homes," In the Proceedings of UbiComp, Sep. 30, 2009, 10 pages.
Kleiner, K., "'Smart Homes' Could Track Your Electrical Noise," New Scientist, Sep. 10, 2007, 2 pages.
Koile, K., Tollmar, K, Demirdjian, D., Shrobe, H., and Darrell, T., "Activity Zones for Context-Aware Computing," Proceedings of UbiComp 2003, Oct. 12-15, 2003, pp. 90-106.
Laughman et al., "Power Signature Analysis." IEEE Power and Engineering Magazine: 56-63, 2003.
Lifton, J., Feldmeier, M., Ono, Y., Lewis, C., and Paradiso, J.A., "A Platform for Ubiquitous Sensor Deployment in Occupational and Domestic Environments," In the Proceedings of the 6th International Conference on Information Processing in Sensor Networks, 2007.
Lorek, M.C., Chraim, F., Pister, K.S.J., and Lanzisera, S. COTS-based stick-on electricity meters for building submetering. 2013 Ieee Sensors, (2013), 1-4.
Mainwaring, S.D., and Woodruff, A., "Investigating Mobility, Technology, and Space in Homes, Starting with Great Rooms," In the Proceedings of EPIC 2005, Nov. 14-15, 2005, pp. 188-195.
Marubayashi, G., "Noise Measurements of the Residential Power Line," Proc. of Int'l. Symposium on Power Line Communications, 1997, pp. 104-108.
Mitchell, T., "Machine Learning," McGraw Hill, 1997.
Mountain, Dean., "Price Influences Demand." DeGroote School of Business, McMaster University: 16 pp., 2008.
Murata et al., "Estimation of Power Consumption for Household Electric Appliances." Proceedings of the 9th International Conference on Neural Information Processing: 2209-2303, 2002.
Murph, D., "Electrical Noise Could Help Automate Your Home," Engadget, Sep. 12, 2007, 4 pages.
N.A., "The Value of Disaggregated Feedback." 1 pg., Nov. 19, 2013.
N.A., "End-User-Deployable Whole House Contact-Less Power Consumption Sensing." UbiComp 2009: 4 pp., 2009.
N.A., "Summary: The Impact of Real-Time Feedback on Residential Electricity Consumption: The Hydro One Pilot." 4 pp., 2006.
O'Brien, J., Rodden, T., Rouncefield, M., and Hughes, J., "At Home with the Technology: An Ethnographic Study of a Set-Top-Box Trial," ACM Transactions on Computer-Human Interaction, Sep. 1999, pp. 282-308, vol. 6, No. 3.
P3 International, "Kill a Watt™, Electricity Usage Monitor", Innovative Electronic Solutions, http://www.p3international.com/products/special/P4400/P4400-CE.html, 2008, 1 page.
Paradiso, J.A., "Some Novel Applications for Wireless Inertial Sensors," Proc. Of NSTI-Nanotech 2006, May 2006, pp. 431-434, Boston, MA.
Parker et al., "Contract Report: Pilot Evaluation of Energy Savings from Residential Energy Demand Feedback Devices." Florida Solar Energy Center, A Research Institute of the University of Central Florida: 32 pp., 2008.
Patel, S.N., Gupta, S., and Reynolds, M.S. The design and evaluation of an end-user-deployable, whole house, contactless power consumption sensor. In CHI 2010.
Patel et al., "At the Flick of a Switch: Detecting and Classifying Unique Electrical Events on the Residential Power Line." UbiComp 2007: 271-288, 2007.
Patel et al., "Detecting Human Movement by Differential Air Pressure Sensing in HVAC System Ductwork: An Exploration in Infrastructure Mediated Sensing." Pervasive: 1-18, 2008.
Patel et al., "PowerLine Positioning: A Practical Sub-Room-Level Indoor Location System for Domestic Use." UbiComp 2006: 441-458, 2006.
Patel, Shwetak., "Bringing Sensing to the Masses: An Exploration in Infrastructure-Mediated Sensing." Intel Labs: 133 pp., 2008.
Philipose, M., Fishkin, K.P., Perkowtiz, M., Patterson, D.J., Fox, D., Kautz, H., and Hähnel, D., "Inferring Activities from Interactions with Objects," IEEE Pervasive Computing, Oct.-Dec. 2004, pp. 10-17, vol. 3, Issue 4.
Product Data Sheet for UBA2021 630 V driver IC for CFL and TL lamps, NXP Semiconductors, Jul. 25, 2008, 16 pages.
Prudenzi, A., "A Neuron Nets Based Procedure fo Identifying Domestic Appliances Pattern-of-Use from Energy Recordings at Meter Panel." IEEE pp. 941-946, 2002.
Ramirez-Munoz et al., "Design and experimental verification of a smart sensor to measure the energy and power consumption in a one-phase AC line." Measurement vol. 42: 412-419, Aug. 2008.
Rosenblat, L., "The Basic Power Supply Tutorial: Design Concepts, Block Diagram, Theory of Operation," http://www.smps.us/power-supply.html, Jun. 8, 2010, 3 pages.

(56) References Cited

OTHER PUBLICATIONS

Rowan, J., and Mynatt, E.D., "Digital Family Portrait Field Trial: Support for Aging in Place," Proc. of ACM Conference (CHI 2005), Apr. 2005, pp. 521-530.
Rubner, J., "Tech Professor Developing Camera Cloak," Atlanta Business Chronicle, Jun. 15, 2007, 2 pages.
Steven C. Venema in a Kalman Filter Calibration Method for Analog Quadrature Position Encoders, Copyright 1994, 99 pages.
"Study Finds Elder Care a Growing Emotional and Financial Burden for Baby Boomers," New ADT monitoring service for elderly helps ease the stress of long distance care giving, PR Newswire Europe, Mar. 29, 2005, 4 pages.
Stuntebeck et al., "Wideband PowerLine Positioning for Indoor Localization." UbiComp 2008: 94-103, 2008.
Tapia, E., et al., "Activity Recognition in the Home Setting Using Simple and Ubiquitous Sensors," Pervasive Computing (Lecture Notes in Computer Science), 2004, pp. 158-175.
Tapia, E., Intille, S., Lopez, L., and Larson, K., "The Design of a Portable Kit of Wireless Sensors for Naturalistic Data Collection," Proc. of Pervasive 2006, pp. 117-134.
Ueno et al., "Effectiveness of Displaying Energy Consumption Data in Residential Houses—Analysis on how the Residents Respond." ECEEE 2005 Summer Study—What Works and Who Delivers?: 1289-1299, 2005.
Abowd, G., and Mynatt, E.D., "Charting Past, Present, and Future Research in Ubiquitous Computing," ACM Transactions on Computer-Human Interaction, Mar. 2000, pp. 29-58, vol. 7, No. 1.
Aipperspach, R., Rattenbury, T., Woodruff, A., and Canny, J., "A Quantitative Method for Revealing and comparing Places in the Home," In the Proceedings of UbiComp 2006, Sep. 2006, pp. 1-18, Orange County, CA.
Aipperspach, R., Woodruff, A., Anderson, K., and Hooker, B., "Maps of Our Lives: Sensing People and Objects Together in the Home," EECS Department, University of California, Berkeley, Nov. 30, 2005, pp. 1-11.
Anant Sahai, Cyclostationary Feature Detection, 2005, DySPAN, pp. 1-69.
Arvola et al., "Billing Feedback as a Means to Encourage Household Electricity Conservation: A Field Experiment in Helsinki." Proceedings of the 1993 Summer Study of the European Council for Energy Efficient Economy: 11-21, 2003.
Beckmann et al., "Some Assembly Required: Supporting End-User Sensor Installation in Domestic Ubiquitous Computing Environments." UbiComp 2004: 107-124, 2004.
Bian, X., Abowd, G.D., and Rehg, J.M., "Using Sound Source Localization to Monitor and Infer Activities in the Home," In the Proceedings of the Third International Conference on Pervasive Computing, May 8-13, 2005.
Bin Fang, "Development of a Wearable Device for Motion Capturing Based on Magnetic and Inertial Measurement Units," vol. 2017, Article ID 7594763, 11 pages, 2017.
Bin, S. and Dowlatabadi, H. Consumer lifestyle approach to US energy use and the related CO2 emissions. Energy Policy 33, 2 (2005), 197-208.
Brandon et al., "Reducing Household Energy Consumption: A Qualitative and Quantitative Field Study." Journal of Environmental Psychology: 75-85, 1999.
Burges, C., "A Tutorial on Support Vector Machines for Pattern Recognition," Journal of Data Mining and Knowledge Discovery, Jun. 1998, pp. 121-167, vol. 2, Kluwer Academic Publishers, Hingham, MA.
Calwell, C. and Reeder, T., "Power Supplies: A Hidden Opportunity for Energy Savings," NRDC, May 22, 2002, 28 pages.
Chen, J., Kam, A.H., Zhang, J., Liu, N., and Shue, L. Bathroom Activity Monitoring Based on Sound. (2005). In Pervasieve 2009, 47-61.
Chetty et al., "Getting to Green: Understanding Resource Consumption in the Home." UbiComp 2008: 242-251, 2008.
Clifford et al., "A Retrofit 60 Hz Current Sensor for Non-Intrusive Power Monitoring at the Circuit Breaker." 8 pp., 2010.

Compliance Certification Services (Shenzhen) Inc., "FCC Class B Compliance Report," prepared for Jet Way Information Co., Ltd., Dec. 29, 2006, 20 pages.
Cooley, J.J., Member, S., and Vickery, D. A Retrofit 60 Hz Current Sensor for Power Monitoring at the Circuit Breaker Panel, 2010.
Crabtree, A., and Rodden, T., "Domestic Routines and Design for the Home," Computer Supported Cooperative Work: The Journal of Collaborative Computing, Kluwer Academic Publishers, 2004, 40 pages, vol. 13 (2).
Crabtree, A., Rodden, T., Hemmings, T., and Benford, S., "Finding a Place for UbiComp in the Home," In the Proceedings of UbiComp 2003, Oct. 12-15, 2003, pp. 208-226, Seattle, Washington.
Darby, S., "Making it Obvious: Designing Feedback into Energy Consumption," Proceedings of the Second International Conference on Energy Efficiency in Household Appliances and Lighting, 2000, 11 pages.
Darby, S., "The Effectiveness of Feedback on Energy Consumption," Environmental Change Institute, University of Oxford, Apr. 2006, pp. 1-21.
Definition of "correlation", thefreedictionary.com, http://www.thefreedictionary.com/p/correlation, last accessed (Oct. 30, 2012).
Drenker et aL, "Nonintrusive monitoring of electronic loads." IEEE pp. 47-51, Oct. 1999.
Edwards, W.K., and Grinter, R.E, "At Home with Ubiquitous Computing: Seven Challenges," In the Proceedings of UbiComp 2001, Sep. 30-Oct. 2, 2001, 17 pages.
Elliot, K., Neustaedter, C., and Greenberg, S., "Time, Ownership and Awareness: The Value of Contextual Locations in the Home," In the Proceedings of UbiComp (Proceedings of the 7th International Conference on Ubiquitous Computing, Tokyo, Japan), 2005.
Fault Tolerant Control and Fault Detection and Isolation, DOI 10.1007/978-0-85729-650-4_2, Springer-Verlag London Limited, 2011, pp. 7-27.
Fischer, Corinna., "Feedback on Household Electricity Consumption: A Tool for Saving Energy?" Energy Efficiency: 79-104, 2008.
Fitzpatrick et al., "Technology-Enabled Feedback on Domestic Energy Consumption: Articulating a Set of Design Concerns." PERVASIVEcomputing: 37-44, 2009.
Fogarty, J., AU, C. and Hudson, S., "Sensing from the Basement: A Feasibility Study of Unobtrusive and Low-Cost Home Activity Recognition," In the Proceedings of ACM Symposium on User Interface Software and Technology.
Formisano, Bob, How to Safely Turn Off Power at the Electrical Panel, http://homerepair.about.com/od/electricalrepair/ss/turn_off main_elect_2_htm?p=1, (Picture from 2009), (last accessed Jun. 13, 2013).
Froehlich, J., Findlater, L., and Landay, J. The design of eco-feedback technology. In CHI 2010, 1999-2008.
Froehlich et al., "Sensing Opportunities for Personalized Feedback Technology to Reduce Consumption." UW CSE Technical Report: CSE 09-13-01: 7 pp., 2009.
Froehlich, J.E., "Sensing and Feedback of Everyday Activities to Promote Environmentally Sustainable Behaviors," Thesis Proposal, Computer Science & Engineering, University of Washington, Jul. 23, 2009, 35 pages, Seattle, Washington.
Froehlich, et. al., "Hydro-Sense: Infrastructure-Mediated Single-Point Sensing of Whole-Home Water Activity," In Proc. of UbiComp 2009, Sep.-Oct. 2009, pp. 235-244, Florida.
Gupta, S., Reynolds, M.S., and Patel, S.N. ElectriSense: Single-Point Sensing Using EMI for Electrical Event Detection and Classification in the Home. In Proc. of UbiComp 2010, 2010.
Hart, George W., Nonintrusive Appliance Load Monitoring, Proceedings of the IEEE, vol. 80, No. 12, Dec. 1992, pp. 1870-1891.
Hemmings, T., Crabtree, A., Rodden, T., Clarke, K., and Rouncefield, M., "Probing the Probes," Proceedings of the 7th Biennial Participatory Design Conference, Jun. 23-25, 2002, pp. 42-50, Malmö, Sweden.
Hirsch et al., "The ELDer Project: Social, Emotional, and Environmental Factors in the Design of Eldercare Technologies." Conference on Universal Usability 2000: 72-79, 2000.
Warner, Hall-Effect Sensors Measure Up, ECN Magazine, http://www.ecnmag.com/print/articles/2009/03/sensor-zone-april-2009, Apr. 2009.

(56) References Cited

OTHER PUBLICATIONS

Weka 3 —Data Mining with Open Source Machine Learning Software in Java, "Weka 3: Data Mining Software in Java," http://www.cs.waikato.ac.nz/ml/weka/, Mar. 2006, 1 page.
Williams, Michael K., "A Discussion of Methods for Measuring Low-Amplitude Jitter," (1995).
Wilson, D., and Atkeson, C., "Simultaneous Tracking and Activity Recognition (STAR) Using Many Anonymous, Binary Sensors," In the Proceedings of Pervasive 2005, pp. 62-79, 2005.
Wood et al., "Energy-Use Information Transfer for Intelligent Homes: Enabling Energy Conservation with Central and Local Displays." Energy and Buildings, vol. 39: 495-503, 2007.
Yunhoon Cho, "Design and Implementation of Practical Step Detection Algorithm for Wrist-Worn Devices," IEEE Sensors Journal, vol. 16, No. 21, Nov. 1, 2016, pp. 7720-7730.
Ito, Masahito et al., "A Method of Appliance Detection Based on Features of Power Waveform," Proceedings of the 2004 International Symposium of Applications and the Internet, Tokyo, Japan, Jan. 26-30, 2004.
International Search Report for International Application No. PCT/US2015/049814, dated Dec. 14, 2015.

\* cited by examiner

SYSTEM FOR MONITORING ELECTRICAL POWER USAGE OF A STRUCTURE AND METHOD OF SAME

CROSS-REFERENCE TO RELATED APPLICATIONS

This application is a divisional of U.S. patent application Ser. No. 14/635,824, filed Mar. 2, 2015, which is a divisional of U.S. patent application Ser. No. 13/175,774, filed Jul. 1, 2011, now U.S. Pat. No. 8,972,211, issued Mar. 3, 2015, which claims the benefit of U.S. Provisional Application No. 61/361,296, filed Jul. 2, 2010, and U.S. Provisional Application No. 61/380,174, filed Sep. 3, 2010. U.S. patent application Ser. Nos. 14/635,824 and 13/175,774, and U.S. Provisional Application Nos. 61/361,296 and 61/380,174 are incorporated herein by reference in their entirety.

FIELD OF THE INVENTION

This invention relates generally to apparatuses, devices, systems, and methods for monitoring electrical power, and relates more particularly to such apparatuses, devices, systems, and methods that monitor electrical power in one or more main electrical power lines at an electrical circuit breaker panel of a structure.

DESCRIPTION OF THE BACKGROUND

A structure can have one or more main electrical power lines that supply the electrical power to electrical devices (i.e., the load) in the structure. The main electrical power lines enter the structure through an electrical circuit breaker panel. An electrical circuit breaker panel is the main electrical distribution point for electricity in a structure. Electrical circuit breaker panels also provide protection from over-currents that could cause a fire or damage to electrical devices in the structure. Electrical circuit breaker panels can have three main power lines and use a split-phase electrical power distribution system.

Different manufacturers of electrical circuit breaker panels, including, for example, Square-D, Eaton, Cutler-Hammer, General Electric, Siemens, and Murray, have chosen different conductor spacing and configurations for their electrical circuit breaker panels. Furthermore, each manufacturer makes many different configurations of electrical circuit breaker panels for indoor installation, outdoor installation, and for different total amperage ratings, of which 100 amperes (A) and 200 A service are the most common in new construction.

The different conductor layouts in the many different types of electrical circuit breaker panels result in different magnetic field profiles at the metal surfaces of the electrical circuit breaker panels. Moreover, the layout of the internal conductors is not visible without opening the breaker panel and the manner in which the internal conductor layout translates into a magnetic field profile at the surface of the electrical circuit breaker panel requires a detailed knowledge of electromagnetic theory to interpret and model correctly. It is, therefore, difficult to accurately measure the magnetic field of the one or more main electrical power lines at a surface of the electrical circuit breaker panel.

Accordingly, a need or potential for benefit exists for an apparatus, system, and/or method that allows a non-electrician to accurately determine the magnetic field of the one or more main electrical power lines at a surface of the electrical circuit breaker panel.

BRIEF DESCRIPTION OF THE DRAWINGS

To facilitate further description of the embodiments, the following drawings are provided in which.

Figure 1:
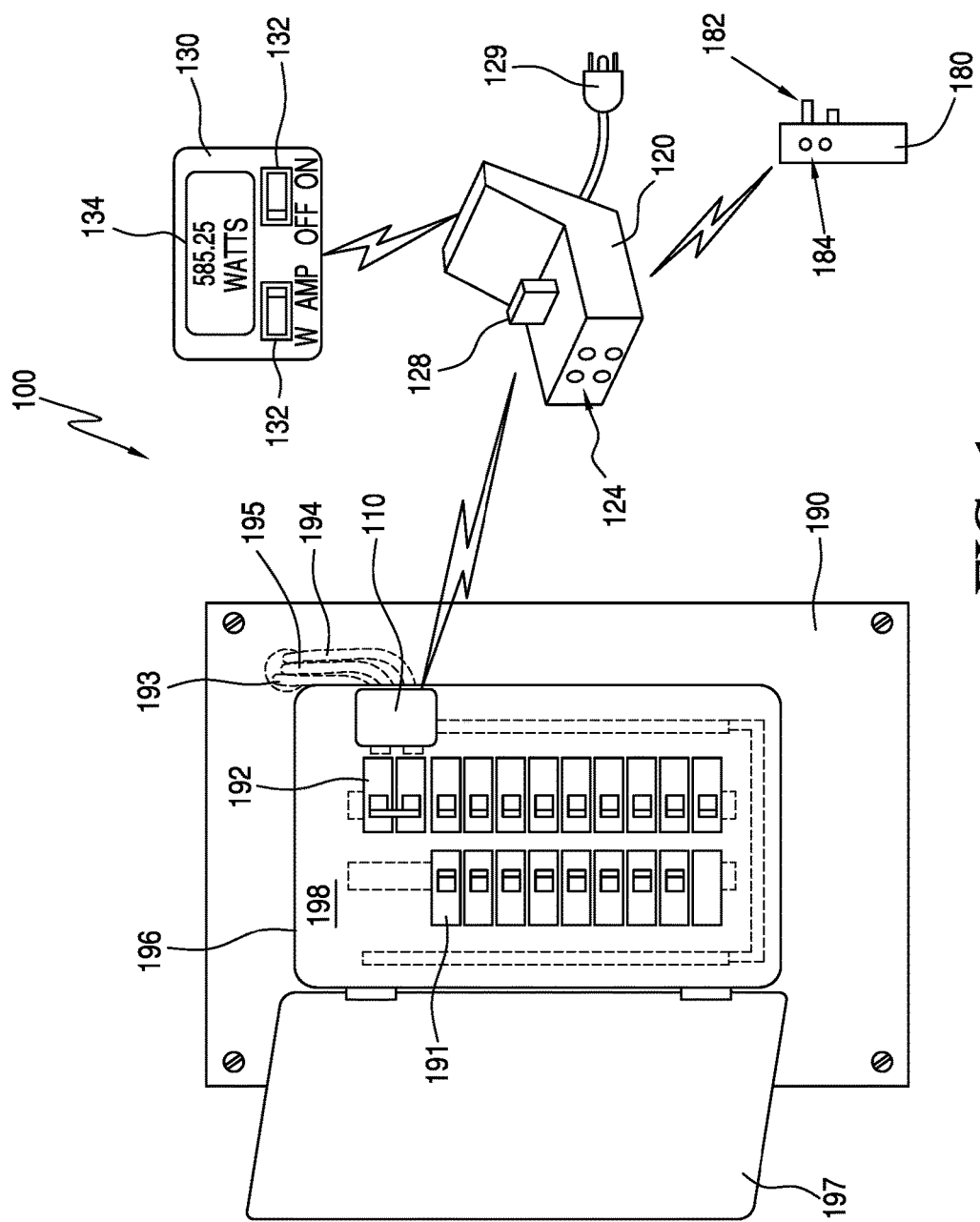
FIG. 1 illustrates a view of an exemplary electrical power monitoring system coupled to an electrical circuit breaker panel, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

DETAILED DESCRIPTION OF EXAMPLES OF EMBODIMENTS

Some embodiments can teach a system for monitoring usage of electrical power by a structure. The structure can have one or more main electrical power lines that supply the electrical power to a first load in the structure. A portion of the one or more main electrical power lines can run substantially parallel to a first axis. The structure can further have a panel that overlies the portion of the one or more main electrical power lines. The system can include: (a) a current sensor unit configured to be coupled to a portion of a surface of the panel, the current sensor unit having: (a) at least one magnetic field sensor having a length substantially parallel to a second axis, wherein the second axis is substantially perpendicular to the first axis, and the at least one magnetic field sensor is configured to detect a magnetic field generated by the one or more main electrical power lines; and (b) a processing unit configured to run on a processor. The current sensor unit can be configured to produce an output signal based on the magnetic field detected by the at least one magnetic field sensor. The processing unit further can be configured to receive the output signal from the current sensor unit and process the output signal to determine one or more parameters related to the usage of the electrical power by the first load in the structure.

Other embodiments can teach an apparatus for measuring electrical current in one or more main electrical power lines of a structure. The structure can have a breaker box. The breaker box can include at least a first part of the one or more main electrical power lines and a metal panel over the first part of the one or more main electrical power lines. The apparatus can include: (a) a sensing device having: (1) one or more electrical current sensors configured to provide two or more current measurements; and (2) one or more magnets coupled to the one or more electrical current sensors; and (b) a processing module configured to run on a computational unit and configured to use the two or more current measurements to determine the electrical current in the one or more main electrical power lines.

Yet other embodiments can disclose a method for providing a system for monitoring usage of electrical power of a structure. The structure can have one or more main electrical power lines that supply the electrical power to a first load in the structure. The one or more main electrical power lines at least partially can run substantially parallel to a first axis. The structure can further having a panel that overlies at least part of the one or more main electrical power lines. The method can include: providing a current sensor unit configured to be coupled to a surface of the panel, the current sensor unit configured to produce an output signal based on a magnetic field generated by the one or more main electrical power lines; and providing a processing unit configured to receive the output signal from the current sensor unit and further configured to process the output signal to determine one or more parameters related to the usage of the electrical power of the structure. Providing the current sensor unit can include: providing at least one magnetic field sensor with a length along a second axis, wherein the at least one magnetic field sensor is configured to detect the magnetic field generated by the one or more main electrical power lines; and mounting the at least one magnetic field sensor at the current sensor unit such that the second axis of the at least one magnetic field sensor is substantially perpendicular to the first axis when the current sensor unit is coupled to the surface of the panel.

Still further embodiments disclose a method for monitoring usage of electrical power of a structure using an electrical power monitoring system. The structure can have one or more main electrical power lines that supply the electrical power to a first load in the structure. The method can include: calibrating the electrical power monitoring system. A first raw current in the one or more main electrical power lines and first calibration data are generated while calibrating the electrical power monitoring system; storing the first calibration data and a measurement of the first raw current; measuring a second raw current; performing a first recalibration of the electrical power monitoring system if the second raw current is not within a predetermined amount of the first raw current; if the second raw current is within the predetermined amount of the first raw current, calculating the first measured current using the first calibration data; and displaying the first measured current. Performing the first recalibration of the electrical power monitoring system can include: calibrating the electrical power monitoring system, a third raw current in the one or more main electrical power lines and second calibration data are generated while performing the first recalibration of the electrical power monitoring system; storing the second calibration data and a measurement of the third raw current; and calculating a first measured current using the second calibration data.

Additional embodiments can include an apparatus for measuring electrical current in one or more main electrical power lines of a structure. The structure can have a breaker box. The breaker box can include at least a first part of the one or more main electrical power lines and a metal panel over the first part of the one or more main electrical power lines. The apparatus can include a sensing device. The sensing device can include one or more electrical current sensors configured to provide two or more current measurements. The sensing device also can include one or more magnets coupled to the one or more electrical current sensors. The apparatus also can include a processing module configured to run on a computational unit and configured to use the two or more current measurements to determine the electrical current in the one or more main electrical power lines.

Further embodiments can include a method for monitoring usage of electrical power of a structure using an electrical power monitoring system. The structure can have one or more main electrical power lines that supply the electrical power to a first load in the structure. The method can include calibrating the electrical power monitoring system. A first raw current in the one or more main electrical power lines and first calibration data can be generated while calibrating the electrical power monitoring system. The method also can include storing the first calibration data and a measurement of the first raw current. The method additionally can include measuring a second raw current. The method further can include calculating a first measured current. The method additionally can include displaying the first measured current.

Figure 2:
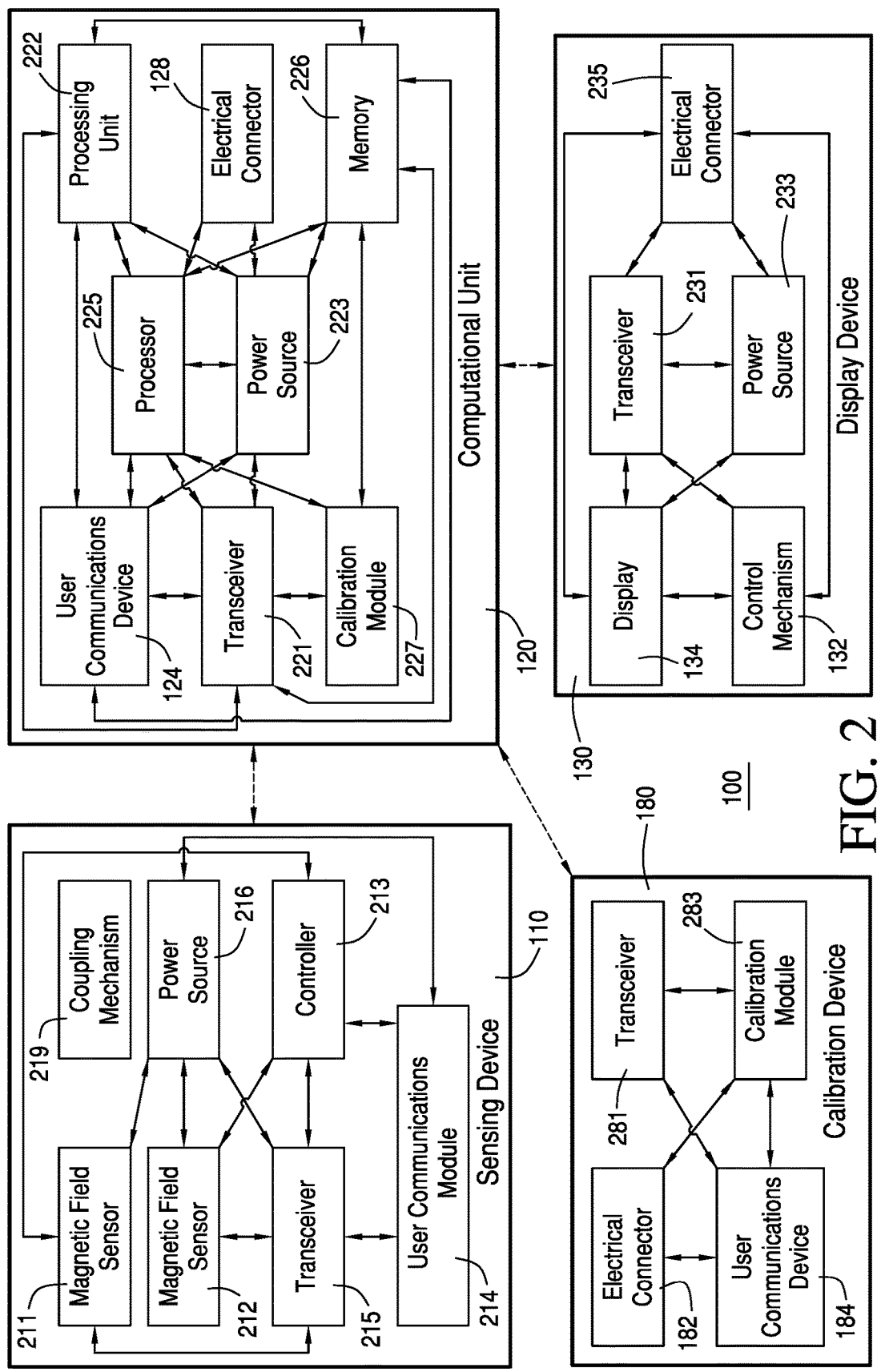
FIG. 2 illustrates a block diagram of the electrical power monitoring system of FIG. 1, according to the first embodiment.

FIG. 1 illustrates a view of an exemplary electrical power monitoring system 100 coupled to an electrical breaker panel 190, according to a first embodiment. FIG. 2 illustrates a block diagram of electrical power monitoring system 100, according to the first embodiment. Electrical power monitoring system 100 can also be considered a system for monitoring electrical power usage of a structure. Electrical power monitoring system 100 is merely exemplary and is not limited to the embodiments presented herein. Electrical power monitoring system 100 can be employed in many different embodiments or examples not specifically depicted or described herein. In some examples, electrical power monitoring system 100 can include: (a) a sensing device 110; (b) a computational unit 120; (c) a display device 130; and (d) a calibration device 180.

Also as shown in FIG. 1, a conventional breaker box or circuit breaker panel 190 can include: (a) two or more individual circuit breakers 191; (b) two or more main circuit breakers 192; (c) main electrical power lines 193, 194, and 195; (d) a panel 196 with an exterior surface 198; and (e) a door 197 that provides access to circuit breakers 191 and 192.

Main electrical power lines 193, 194, and 195 are electrically coupled to main circuit breakers 192 and supply the electrical power to electrical devices (i.e., the load) in the structure. Panel 196 overlies at least part of main electrical power lines 193, 194, and 195 and associated circuitry to protect people from inadvertently contacting these energized conductors. Usually, panel 196 comprises steel or another metal.

System 100 can determine the load current in main electrical power lines 193, 194, and 195 by positioning sensing device 110 at surface 198 of panel 196 and measuring the induced voltage in sensing device 110. Electrical power monitoring system 100 can use the measured induced voltage to calculate the electrical current and electrical power in main electrical power lines 193, 194, and 195.

It is possible to place sensing device 110 anywhere on surface 198 of panel 196 and accurately determine the current in each of the individual branches (including reactive loads). However, to obtain accurate current measurements requires that the magnetic fields from main electrical power lines 193, 194, and 195 to see the same reactance from panel 196 and sensing device 110. If the reactance is not the same, it becomes more difficult to accurately calculate the electrical current and electrical power in main electrical power lines 193, 194, and 195.

Figure 3:
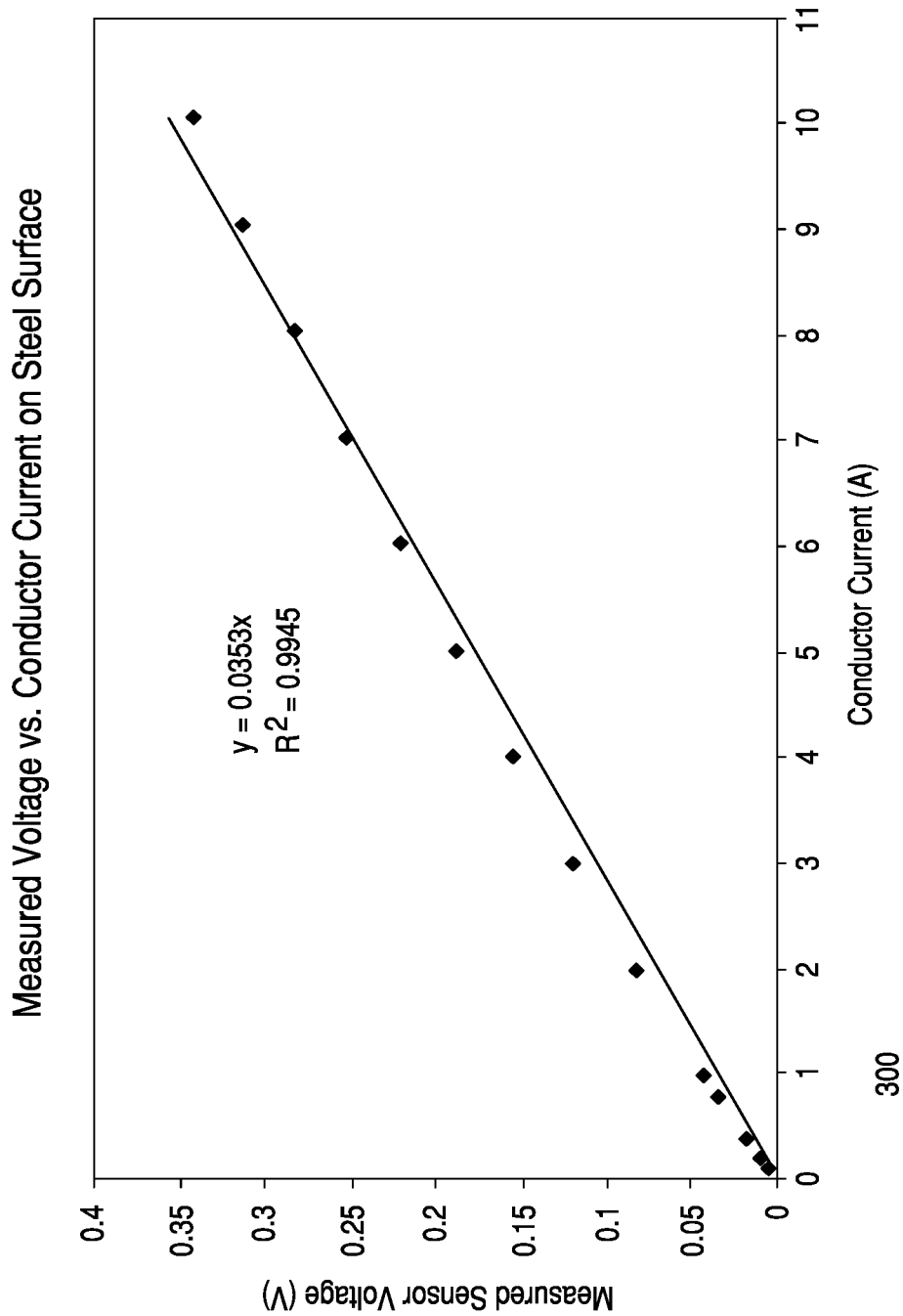
FIG. 3 is a graph illustrating the induced voltage versus conductor current for an exemplary electrical circuit breaker panel with a metal panel overlying the main electrical power lines, according to an embodiment.
Figure 4:
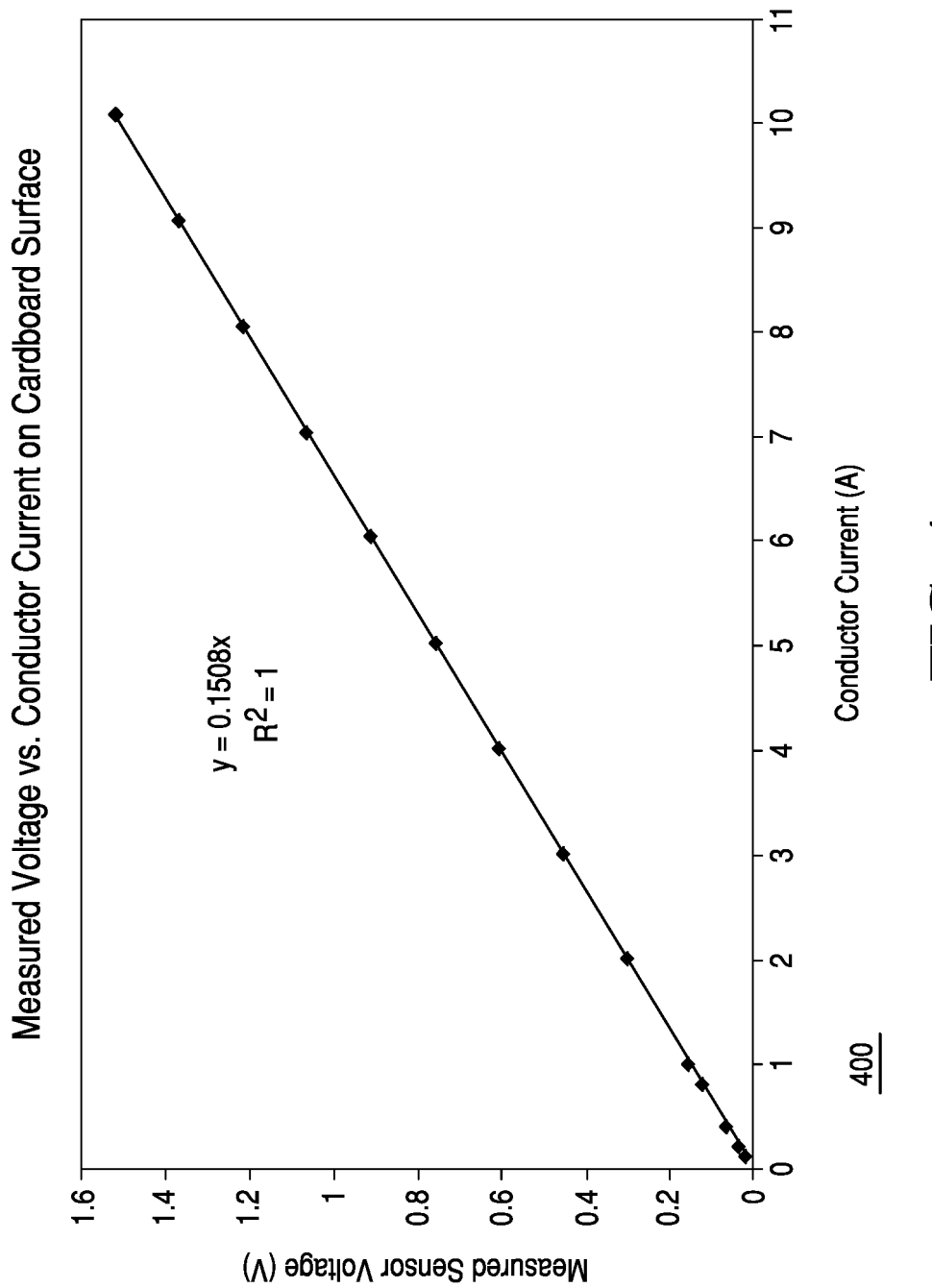
FIG. 4 is a graph illustrating the induced voltage versus conductor current for an exemplary electrical circuit breaker panel with a cardboard panel overlying the main electrical power lines, according to an embodiment.

Another potential limitation of measuring the magnetic field created by main electrical power lines 193, 194, and 195 using a sensor unit over panel 196 is that the metal in panel 196 can cause the induced voltage to vary non-linearly with the amount of current passing through main electrical power lines 193, 194, and 195. Furthermore, the non-linearity of the permeability of the metal of panel 196 can vary from position to position across panel 196. FIG. 3 is a graph 300 illustrating the induced voltage versus conductor current for an exemplary electrical circuit breaker panel with a metal panel overlying the main electrical power lines. FIG. 4 is a graph 400 illustrating the induced voltage versus conductor current for an exemplary electrical circuit breaker panel where the metal panel has replaced with a cardboard panel.

Figure 5:
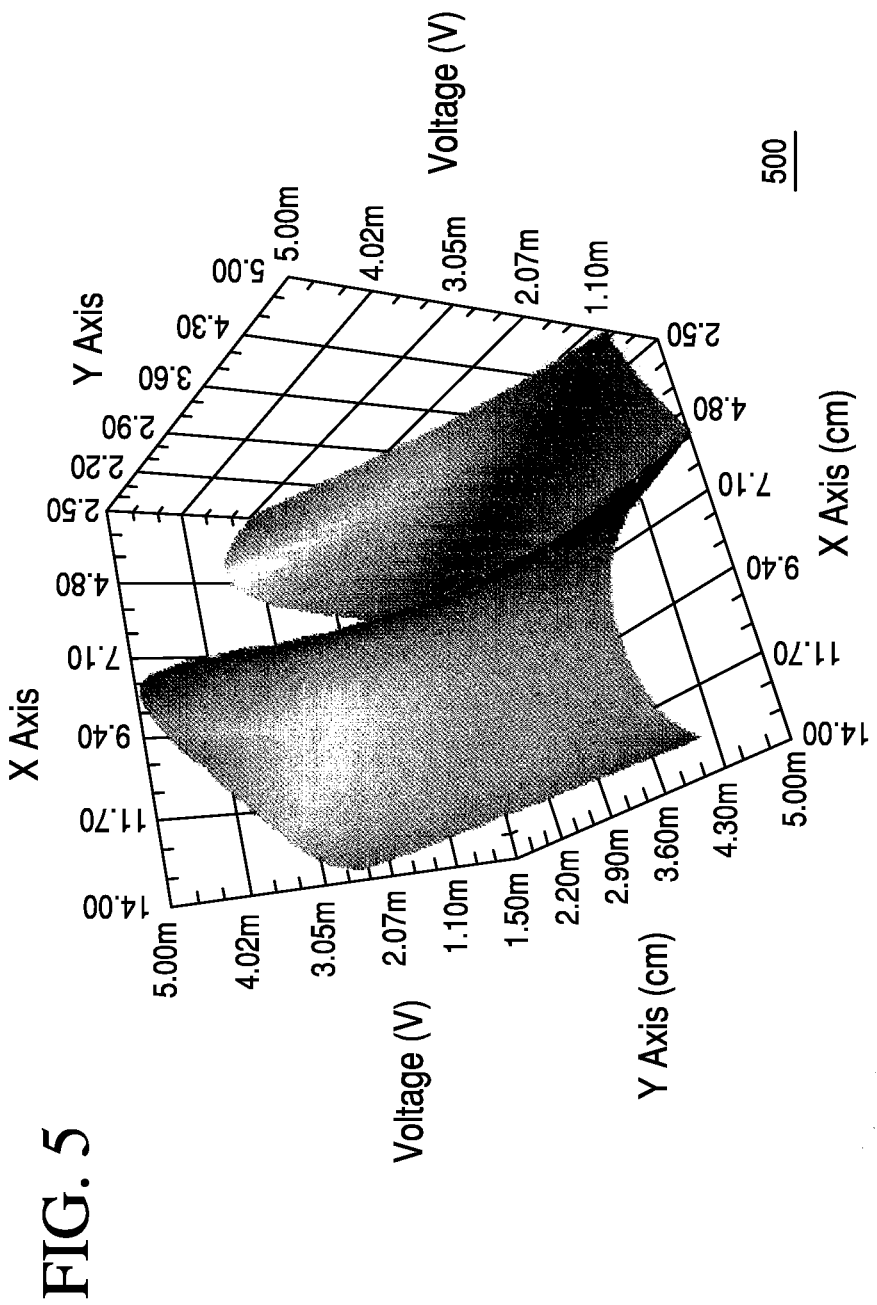
FIG. 5 is a three-dimensional graph illustrating the measured voltage when a magnetic field sensor is moved horizontally over an electrical conductor and at different heights above the electrical conductor when a steel plate is placed between the electrical conductor and the magnetic field sensor, according to an embodiment.
Figure 6:
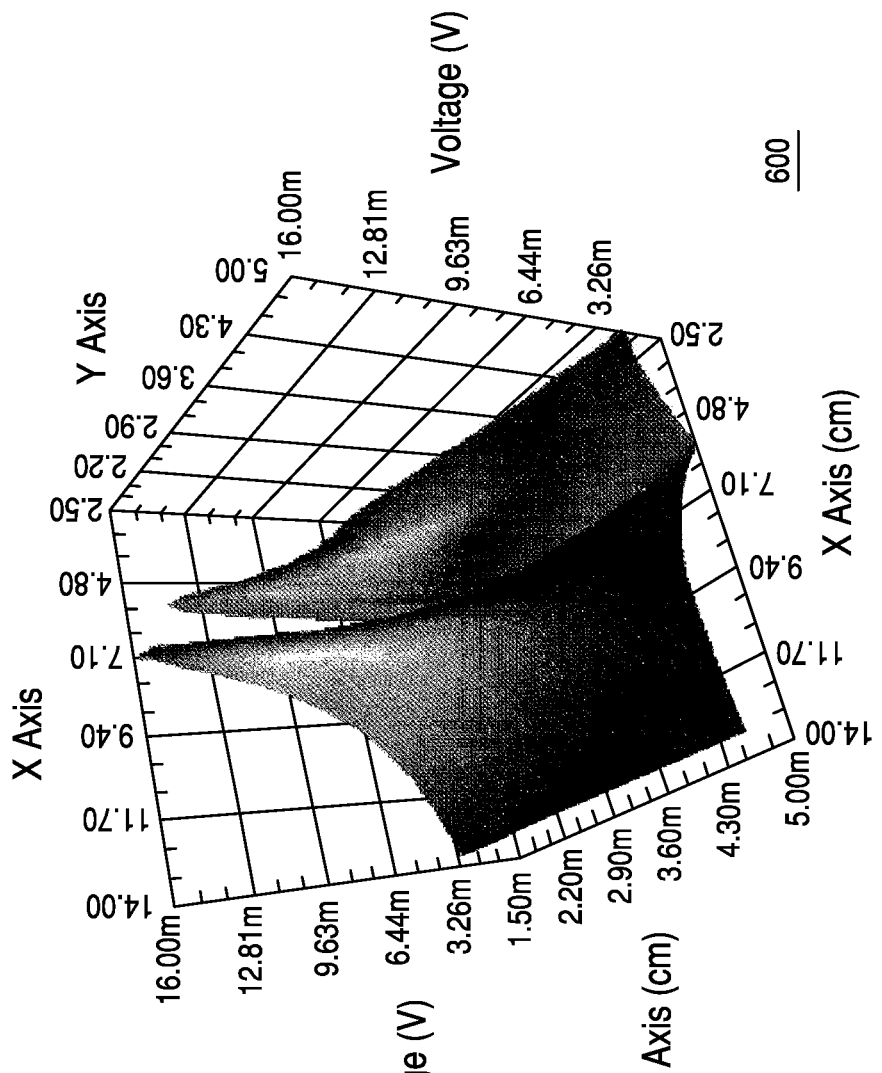
FIG. 6 is a three-dimensional graph illustrating the measured voltage when a magnetic field sensor is moved horizontally over an electrical conductor and at different heights above the electrical conductor, according to an embodiment.

Similarly, FIG. 5 is a three-dimensional graph 500 illustrating the voltage measured using a magnetic field sensor moved horizontally over an electrical conductor (x-axis) and at different heights above the conductor (y-axis) when a steel plate is placed between the conductor and the magnetic field sensor. FIG. 6 is a three-dimensional graph 600 illustrating the voltage measured using a magnetic field sensor moved horizontally over an electrical conductor (x-axis) and at different heights above the conductor (y-axis) without a steel plate between the conductor and the magnetic field sensor. As illustrated in FIGS. 2-6, the use of a metal panel overlying the main electrical power lines (i.e., panel 196 (FIG. 1)) compared to the use of non-magnetic material (i.e., cardboard) or no material causes a significant non-linearity of the measure voltage on the surface of the panel opposite the main electrical power lines. Furthermore, as shown in FIGS. 5 and 6, this non-linearity in position dependent. That is, the amount of the non-linearity varies based on the position of the sensor on the steel panel. As will be described below, electrical power monitoring system 100 can compensate or eliminate the non-linearity is the induced voltage in sensing device 110 caused by the use of metal in panel 196. Moreover, electrical power monitoring system 100 can ensure that main electrical power lines 193, 194, and 195 see the same reactance from panel 196 and sensing device 110.

Referring again to FIG. 2, sensing device 110 can include: (a) two or more electrical current sensors or magnetic field sensors 211 and 212; (b) a controller 213; (c) a user communications module 214; (d) a transceiver 215; (e) a power source 216; and (f) a coupling mechanism 219. Controller 213 can be used to control magnetic field sensors 211 and 212, user communications module 214, transceiver 215 and power source 216. In some embodiments, sensing device 110 can include two, four, six, or eight magnetic field sensors. In various examples, magnetic field sensors 211 and 212 can be 2.5 millimeters (mm) to 12.7 mm in diameter.

In various examples, sensing device 110 can be configured to be coupled to surface 198 (FIG. 1) of panel 196 (FIG. 2) using coupling mechanism 219. In some examples, coupling mechanism 219 can include an adhesive, a Velcro® material, a magnet, or another attachment mechanism.

Figure 7:
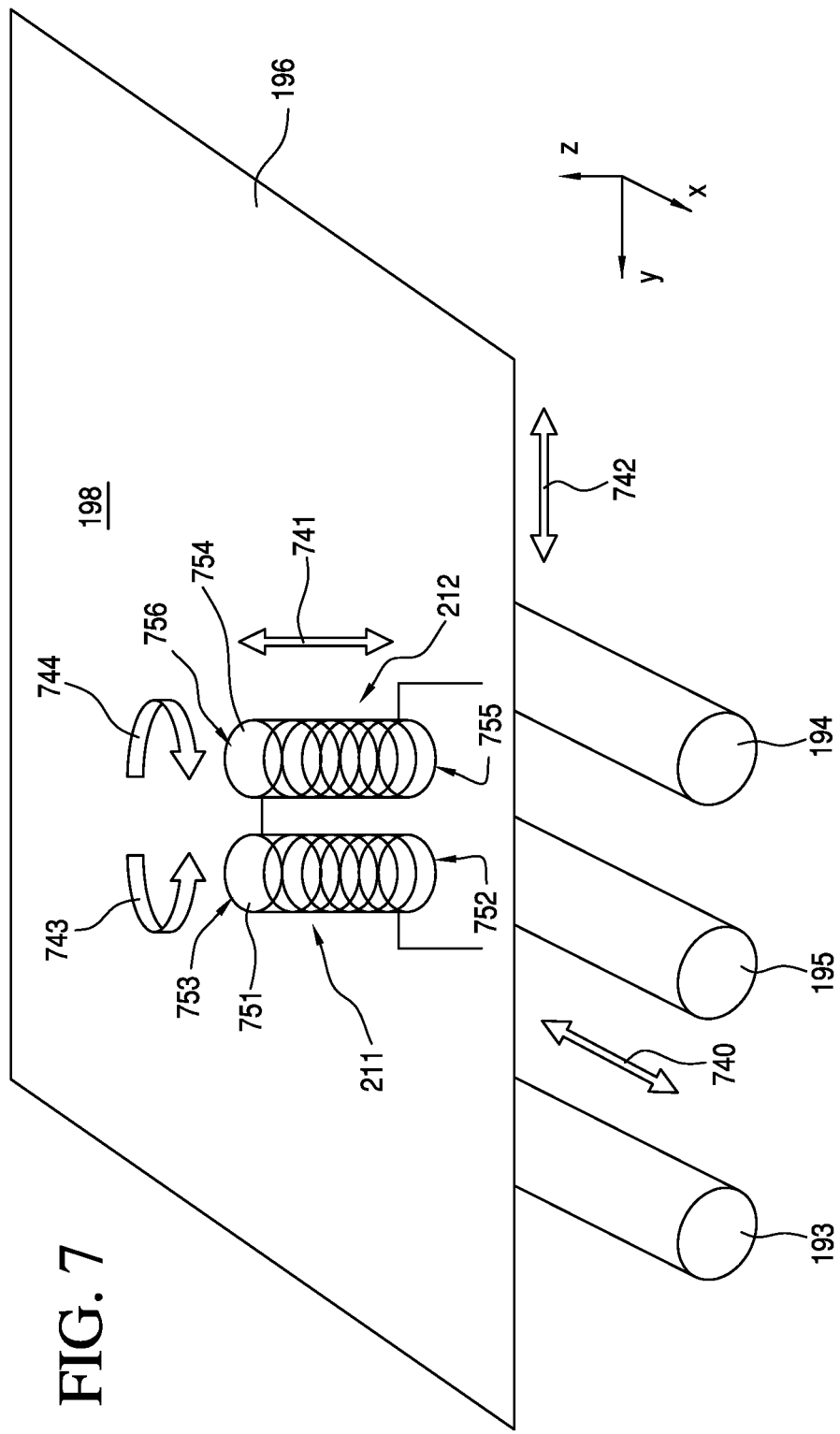
FIG. 7 illustrates exemplary magnetic field sensors located over a surface of the electrical circuit breaker panel of FIG. 1, according to the first embodiment.

In many embodiments, magnetic field sensors 211 and 212 can include coiled conductors (e.g., coiled wires). FIG. 7 illustrates exemplary magnetic field sensors 211 located over surface 198 of panel 196 with main electrical power lines 193, 194, and 195 under panel 196, according to the first embodiment. In many embodiments, magnetic field sensor 211 can include a coiled conductor 751 with a first end 752 and a second end 753 opposite the first end 752. In some examples, coiled conductor 751 can be coiled in a first direction 743 (e.g., counter-clockwise). Magnetic field sensor 212 can include a coiled conductor 754 with a first end 755 and a second end 756 opposite the first end 755. Coiled conductor 754 can be coiled in a second direction 744 (e.g., clockwise). In many examples, the first direction 743 of the coiling of coiled conductor 751 can be opposite the second direction 744 of the coiling of coiled conductor 754. Coiling the conductor in magnetic field sensors 211 and 212 can help eliminate the non-linearity in the magnetic field.

In various examples, coiled conductors 751 and 754 can be 2 millimeters (mm) to 12 mm in diameter. Coiled conductor 751 can be spaced apart from coiled conductor 754 by 12 mm to 40 mm. In some examples, the total width of two or more magnetic field sensors can be up to 160 mm. In some examples, coiled conductors can have an air core or a steel core.

In some examples, at least a portion of surface 198 can be substantially parallel to axes 740 and 742 with at least axis 740 substantially perpendicular to axis 742. In the same or different examples, at least portion of main electrical power lines 193, 194, and 195 can run substantially parallel to axis 740. In the embodiment shown in FIG. 7, axis 741 is substantially perpendicular to axes 740 and 742. Also, axis 741 can run along a length of coiled conductor 751 from first end 752 to second end 753 and along a length of coiled conductor 754 from first end 755 to second end 756. That is, coiled conductors 751 and 754 can be substantially perpendicular to surface 198 and main electrical power lines 193, 194, and 195.

When magnetic field sensors are placed in the configuration shown in FIG. 7, main electrical power lines 193, 194, and 195 see the substantially the same reactance from panel 196 and sensing device 110. Furthermore, when an electrical power monitoring system has the configuration show in FIG. 7, the steel plate and coiled conductors 751 and 754 have a constant reactance.

To illustrate that the sensor configuration shown in FIG. 7 has a substantially constant reactance, a fixed current can be placed in main electrical power lines 193, 194, and 195 and coiled conductor 751 can be moved relative to main electrical power lines 193, 194, and 195 while measuring the phase angle of the received signal. If the reactance is constant, the measured phase angle in an ideal coil conductor will exhibit bistable behavior with only two phases that are 180° apart.

Figure 8:
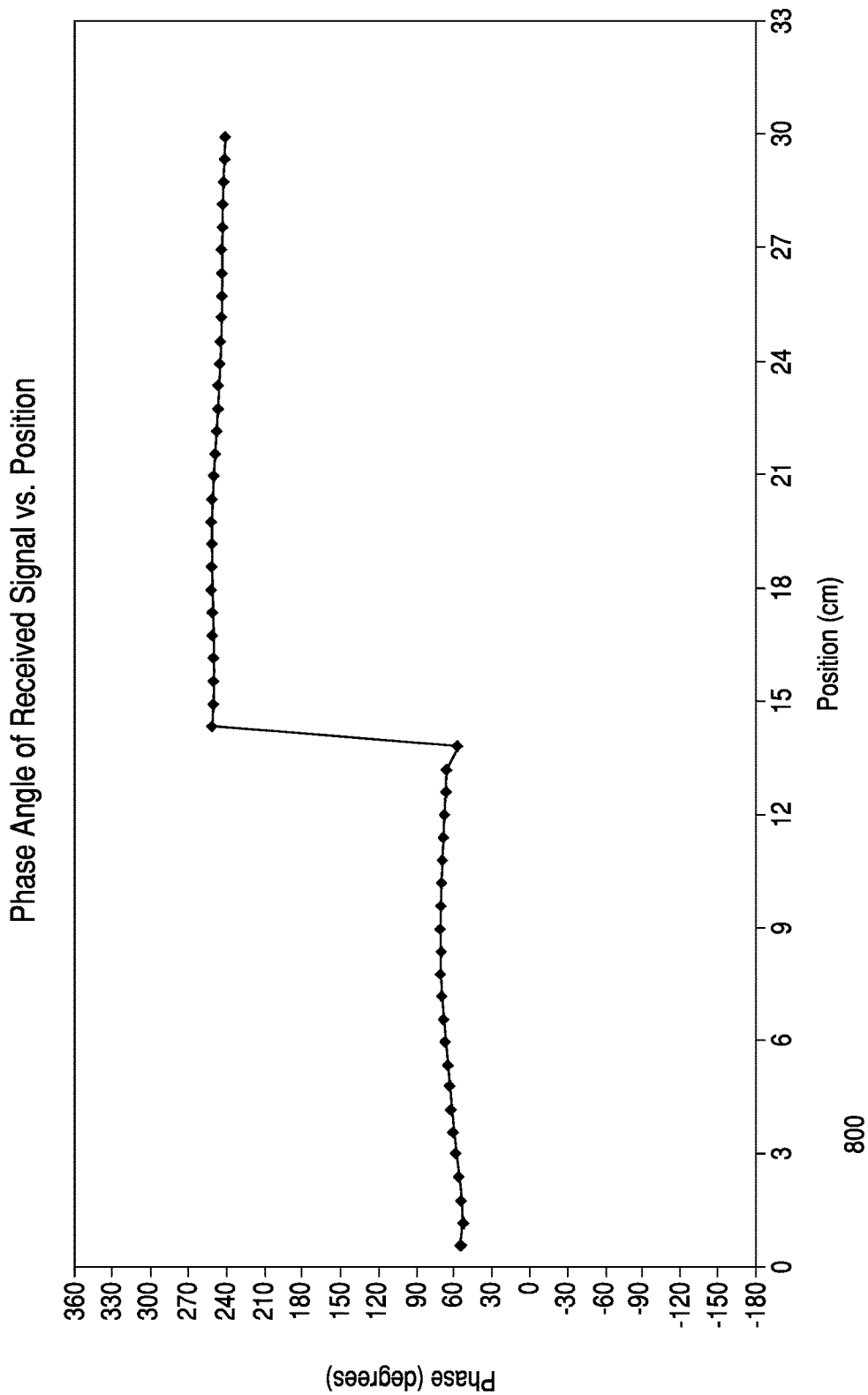
FIG. 8 is a graph illustrating a phase angle of a received sign relative to the voltage versus a position measured using the magnetic fields sensors of FIG. 7, according an embodiment.

FIG. 8 is a graph 800 illustrating phase angle of a received sign relative to the voltage versus position for electrical power monitoring system 100, according an embodiment. To create graph 800, a fixed current was placed in main electrical power lines 193, 194, and 195 and coiled conductor 751 was moved in approximately 0.6 centimeter (cm) increments relative to main electrical power lines 193, 194, and 195 while measuring the phase angle of the received signal relative to the voltage. As shown in FIG. 8, the phase angle exhibits bistable behavior with has two different phases that are approximately 180° apart. The phase shift occurs when the coil conductor passed over the center of main electrical power line 195. Thus, reactance of coiled conductor 751 and panel 196 as seen by main electrical power lines 193, 194, and 195 is substantially constant.

Returning to FIG. 2, transceiver 215 can be electrically coupled to magnetic field sensors 211 and 212 and controller 213. In some examples, transceiver 215 communicates the voltages or other parameters measured using magnetic field sensors 211 and 212 to transceiver 221 of computational unit 120. In many examples, transceiver 215 and transceiver 221 can be wireless transceivers. In some examples, electrical signals can be transmitted using WI-FI (wireless fidelity), the IEEE (Institute of Electrical and Electronics Engineers) 802.11 wireless protocol or the Bluetooth 3.0+HS (High Speed) wireless protocol. In further examples, these signals can be transmitted via a Zigbee (802.15.4), Z-Wave, or a proprietary wireless standard. In other examples, transceiver 215 and transceiver 221 can communicate electrical signals using a cellular or wired connection.

Computational unit 120 can include: (a) transceiver 221; (b) a processing module or unit 222; (c) a power source 223; (d) a user communications device 124; (e) a processor 225; (f) memory 226; (g) calibration module 227; and (h) electrical connector 128. Computational unit 120 can be configured to receive the output signal from sensing device 110 via transceiver 221 and process the output signal to determine one or more parameters related to the electrical power usage of the structure (e.g., the electrical power used by the structure and the electrical current in main electrical power lines 193, 194, and 195).

In some examples, processing unit 222 can be stored in memory 226 and configured to run on processor 225. Processing unit 222 can be further configured use the current measurements from sensing device 110 to determine one or more parameters related to the electrical power usage of the structure (e.g., the electrical current and electrical power of main electrical power lines 193, 194, and 195). When computational unit 120 is running, program instructions stored in memory 226 are executed by processor 225. A portion of the program instructions, stored in memory 226, can be suitable for carrying out method 2200 (FIG. 22) as described below and/or processing unit 222.

Calibration module 227 can include one or more calibration loads. In some examples, the one or more calibration loads can be electrically coupling to the first phase branch of the electrical power line infrastructure of structure to help calibrate electrical power monitoring system 100 using electrical connector 128. User communications device 124 can be configured to display information to a user. In one example, user communications device 124 can be a monitor, a touch screen, and/or one or more LEDs (light emitting diodes).

Power source 223 can provide electrical power to transceiver 221, a user communications device 124, a processor 225, and memory 226. In some examples, power source 223 can include electrical plug 129 that can be coupled to an electrical wall outlet.

Display device 130 can include (a) a display 134; (b) a control mechanism 132; (c) a transceiver 231 configured to communicate with transceiver 221; (d) power source 233; and/or (e) electrical connector 235. In some embodiments, electrical connector 235 can be configured to couple to electrical connector 128 to couple display device 130 to computational unit 120.

Calibration device 180 can include: (a) a transceiver 281; (b) an electrical connector 182; (c) a calibration module 283; and (d) a user communication device 184. In some examples, transceiver 281 can be similar or the same as transceivers 215, 221, and/or 231. Electrical connector 182 can be an electrical power plug in some examples. User communication device 184 can be configured to display information to a user. In one example, user communication device 184 can be one or more LEDs.

Calibration module 283 can include one or more calibration loads. In some examples, the one or more calibration loads can be electrically coupling to the second phase branch of the electrical power line infrastructure of structure to help calibrate electrical power monitoring system 100. That is, in some examples, electrical connector 128 is coupled to an electrical wall outlet coupled to the first phase of the electrical power (e.g. main electrical power line 193 or L1) and electrical connector 182 is coupled to an electrical wall outlet coupled to the second phase of the electrical power (e.g. main electrical power line 194 or L2). In these examples, main electrical power line 195 is the ground line.

Figure 9:
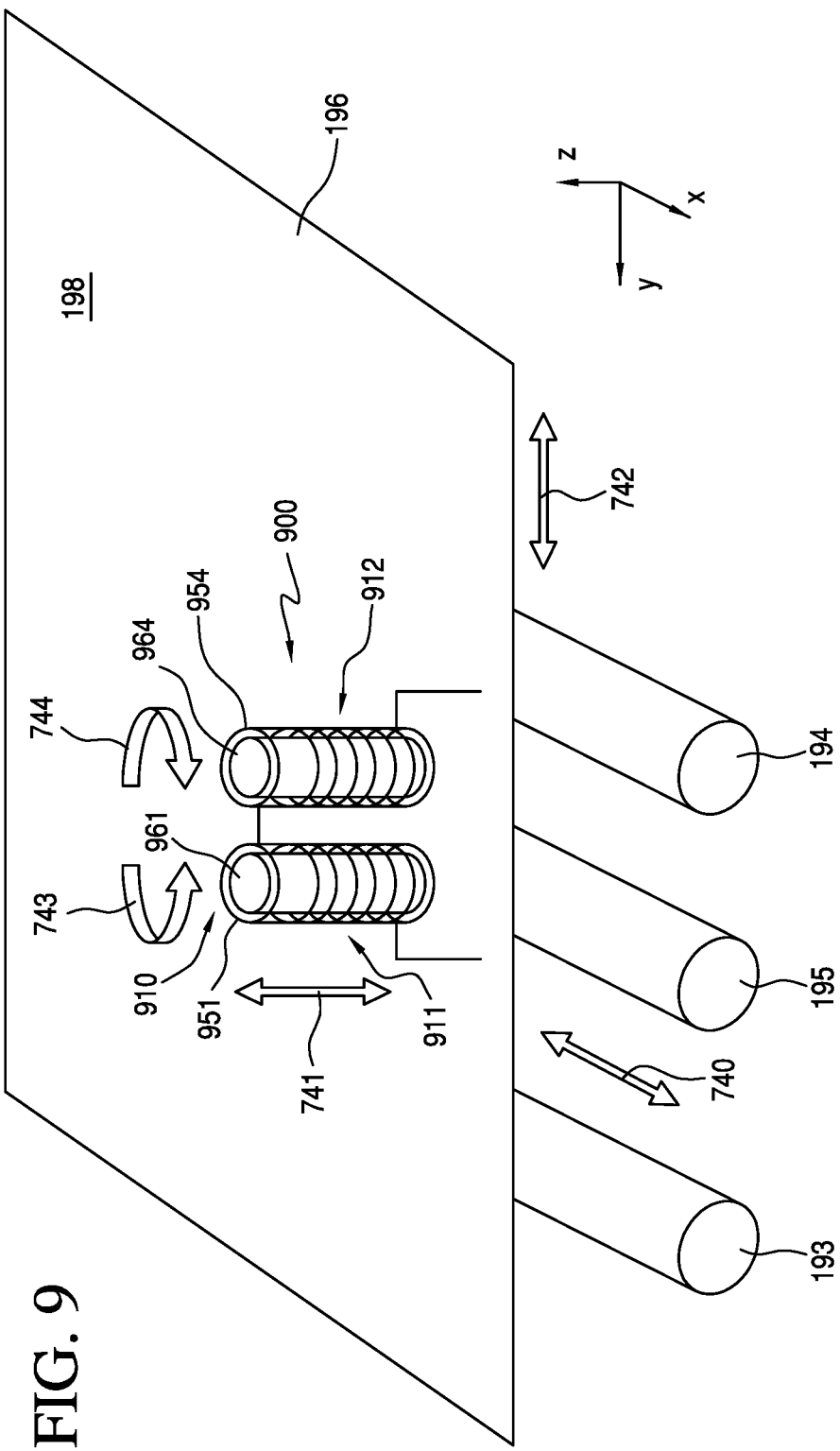
FIG. 9 illustrates exemplary magnetic field sensors of electrical power monitoring system located over a surface of the electrical circuit breaker panel of FIG. 1, according to an embodiment different from FIG. 7.

FIG. 9 illustrates exemplary magnetic field sensors 911 and 912 of electrical power monitoring system 900 located over surface 198 of panel 196 with main electrical power lines 193, 194, and 195 under panel 196, according to an embodiment. Electrical power monitoring system 900 can also be considered a system for monitoring electrical power usage of a structure. Electrical power monitoring system 900 is merely exemplary and is not limited to the embodiments presented herein. Electrical power monitoring system 900 can be employed in many different embodiments or examples not specifically depicted or described herein.

Referring to FIG. 9, in some examples, electrical power monitoring system 900 can include: (a) a sensing device 910; (b) a computational unit 120 (FIGS. 1 and 2); (c) a display device 130 (FIGS. 1 and 2); and (d) a calibration device 180 (FIGS. 1 and 2). Sensing device 910 can include: (a) two or more electrical current sensors or magnetic field sensors 911 and 912; (b) magnet or magnetic cores 961 and 964; (c) a controller 213 (FIG. 2); (d) a user communications module 214 (FIG. 2); (e) a transceiver 215 (FIG. 2); (f) a power source 216 (FIG. 2); and (g) a coupling mechanism 219 (FIG. 2). Magnetic cores 961 and 964 can be considered part of or coupled to magnetic field sensors 911 and 912. In some examples, magnetic cores 961 and 964 can include an electromagnet or a permanent magnet. Magnetic cores 961 and 964 can be configured to help coupled sensing device 910 to surface 198. In some examples, the north and south poles of magnetic cores 961 and 964 can be located at the ends of the each magnetic core.

In many examples, magnetic field sensors 911 and 912 can include coiled conductors (e.g., coiled wires). In many embodiments, magnetic field sensor 911 can include a coiled conductor 751 with a first end 752 and a second end 753 opposite the first end 752. In some examples, coiled conductor 751 can be coiled around magnetic core 961 in a first direction 743 (e.g., counter-clockwise). Magnetic field sensor 912 can include a coiled conductor 754 with a first end 755 and a second end 756 opposite the first end 755. Coiled conductor 754 can be coiled around magnetic core 964 in a second direction 744 (e.g., clockwise). In many examples, the first direction 743 of the coiling of coiled conductor 751 can be opposite the second direction 744 of the coiling of coiled conductor 754.

In some examples, at least a portion of surface 198 can be substantially parallel to axes 740 and 742 with at least axis 740 substantially perpendicular to axis 742. In the same or different examples, at least portion of main electrical power lines 193, 194, and 195 can run substantially parallel to axis 740. In the embodiment shown in FIG. 9, axis 741 is substantially perpendicular to axes 740 and 742. That is, coiled conductors 751 and 754 can be substantially perpendicular to surface 198 and main electrical power lines 193, 194, and 195. Furthermore, one end of magnetic cores 961 and 964 can be configured to couple to surface 198 of panel 196.

In some examples, magnetic cores 961 and 964 can help equalize the reactance of panel 196 and coiled conductors 951 and 954 by saturating the magnetic field in the region of panel 196 near magnetic cores 961 and 964. Thus, reactance of coiled conductors 951 and 954 and panel 196 as seen by main electrical power lines 193, 194, and 195 is substantially constant and the non-linearity of the magnetic filed caused by panel 196 is substantially eliminated.

Figure 10:
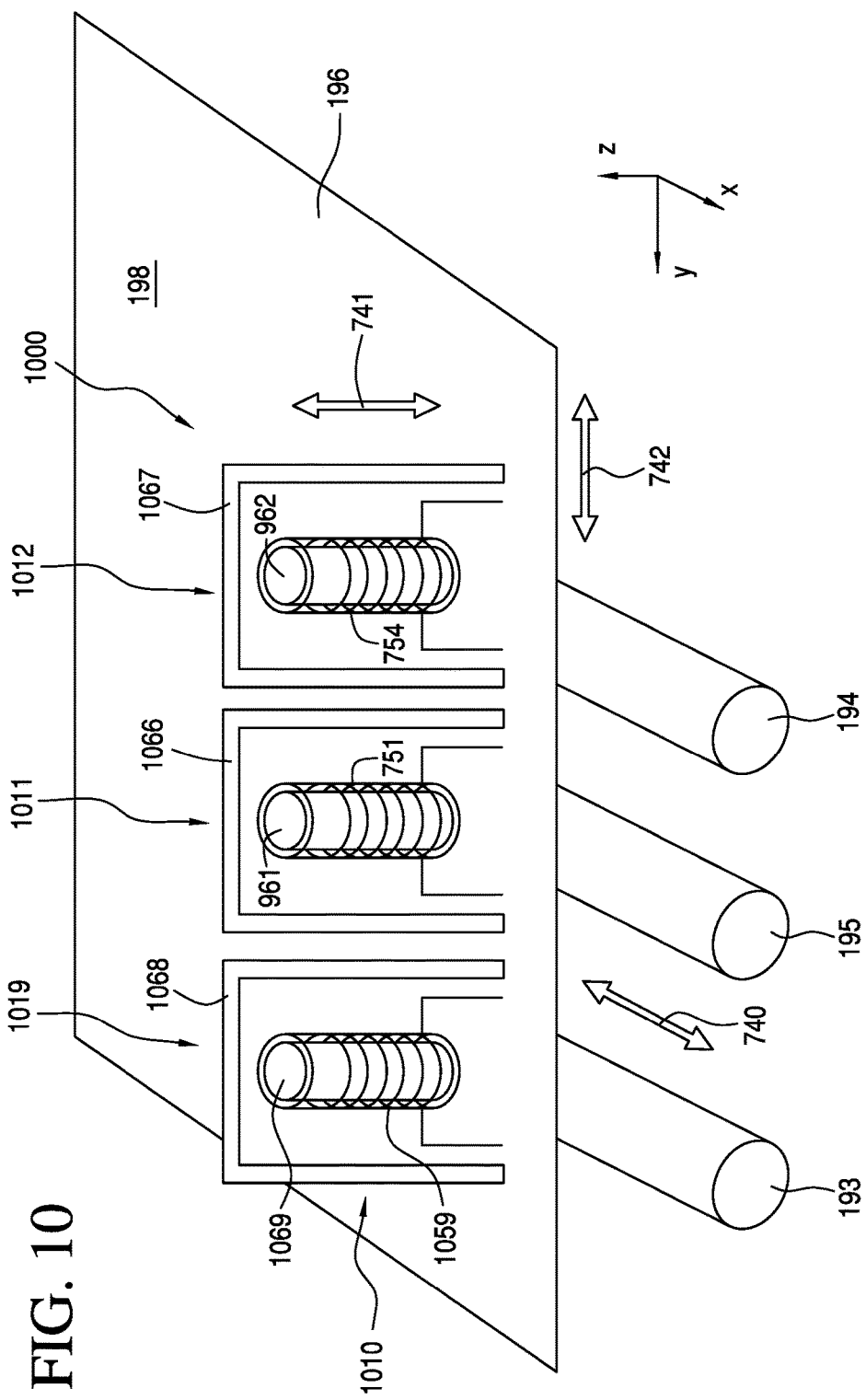
FIG. 10 illustrates exemplary magnetic field sensors of an electrical power monitoring system located on a surface of the electrical circuit breaker panel of FIG. 1, according to an embodiment different from FIGS. 7 and 9.

FIG. 10 illustrates exemplary magnetic field sensors 1011, 1012, and 1019 of electrical power monitoring system 1000 located on surface 198 of panel 196, according to an embodiment. Electrical power monitoring system 1000 can also be considered a system for monitoring electrical power usage of a structure. Electrical power monitoring system 1000 is merely exemplary and is not limited to the embodiments presented herein. Electrical power monitoring system 1000 can be employed in many different embodiments or examples not specifically depicted or described herein.

In some examples, electrical power monitoring system 1000 can include: (a) a sensing device 1010; (b) a computational unit 120 (FIGS. 1 and 2); (c) a display device 130 (FIGS. 1 and 2); and (d) a calibration unit 180 (FIGS. 1 and 2). Sensing device 1010 can include: (a) two or more electrical current sensors or magnetic field sensors 1011, 1012, and 1019; (b) one or more magnets or magnetic cores 961, 964, and 1069; (c) a controller 213 (FIG. 2); (d) a user communications module 214 (FIG. 2); (e) a transceiver 215

(FIG. 2); (f) a power source 216 (FIG. 2); (g) a coupling mechanism 219 (FIG. 2); and (h) one or more ferromagnetic cups or domes 1066, 1067, and 1068. In many embodiments, magnetic field sensors 1011, 1012, and 1019 can include coiled conductors 751, 754, and 1059, respectively. In some examples, coiled conductor 1059 can be similar or the same as coiled conductors 751 and/or 754. Coiled conductors 751, 754, and 1059 can be wrapped around magnetic cores 961, 964, and 1069, respectively. In various embodiments, magnetic cores 961, 964, and 1069 can be coupled to ferromagnetic cups or domes 1066, 1067, and 1068. In many embodiments, magnetic cores 961, 964, and 1069 can extend beyond coiled conductors 751, 754, and 1059, respectively, and be coupled to ferromagnetic cups or domes 1066, 1067, and 1068.

Domes 1066, 1067, and 1068 can be located over coiled conductors 751, 754, and 1059, respectively. That is, coiled conductors 751, 754, and 1059 are inside or enclosed by domes 1066, 1067, and 1068, respectively. In some examples, the north and south poles of magnetic cores 961, 964, and 1069 can be located at the ends of the each magnetic core. Domes 1066, 1067, and 1068 can be made from steel or another ferromagnetic material.

In some examples, magnetic cores 961, 964, and 1069 can help equalize the reactance of panel 196 and coiled conductors 951, 954, and 1079, respectively, by saturating the magnetic field in the region of panel 196 near coiled conductors 951, 954, and 1079. Domes 1066, 1067, and 1068 can further focus the magnetic flux lines in the region around and/or below of magnetic cores 961, 964, and 1069, respectively. Thus, the reactance of coiled conductors 951, 954, and 1079 and panel 196 as seen by main electrical power lines 193, 194, and 195 is substantially constant and the non-linearity of the magnetic field caused by panel 196 is eliminated.

Furthermore, the magnetic field focusing effects of domes 1066, 1067, and 1068 can help decrease the cost of electrical power monitoring system 1000. Because the magnetic field is more focused when domes 1066, 1067, and 1068 are used, magnetic cores 961, 964, and 1069 can be weaker magnets. Accordingly, electrical power monitoring systems with ferromagnetic domes can use less magnetic material or less costly (i.e., weaker) magnetic material.

Figure 11:
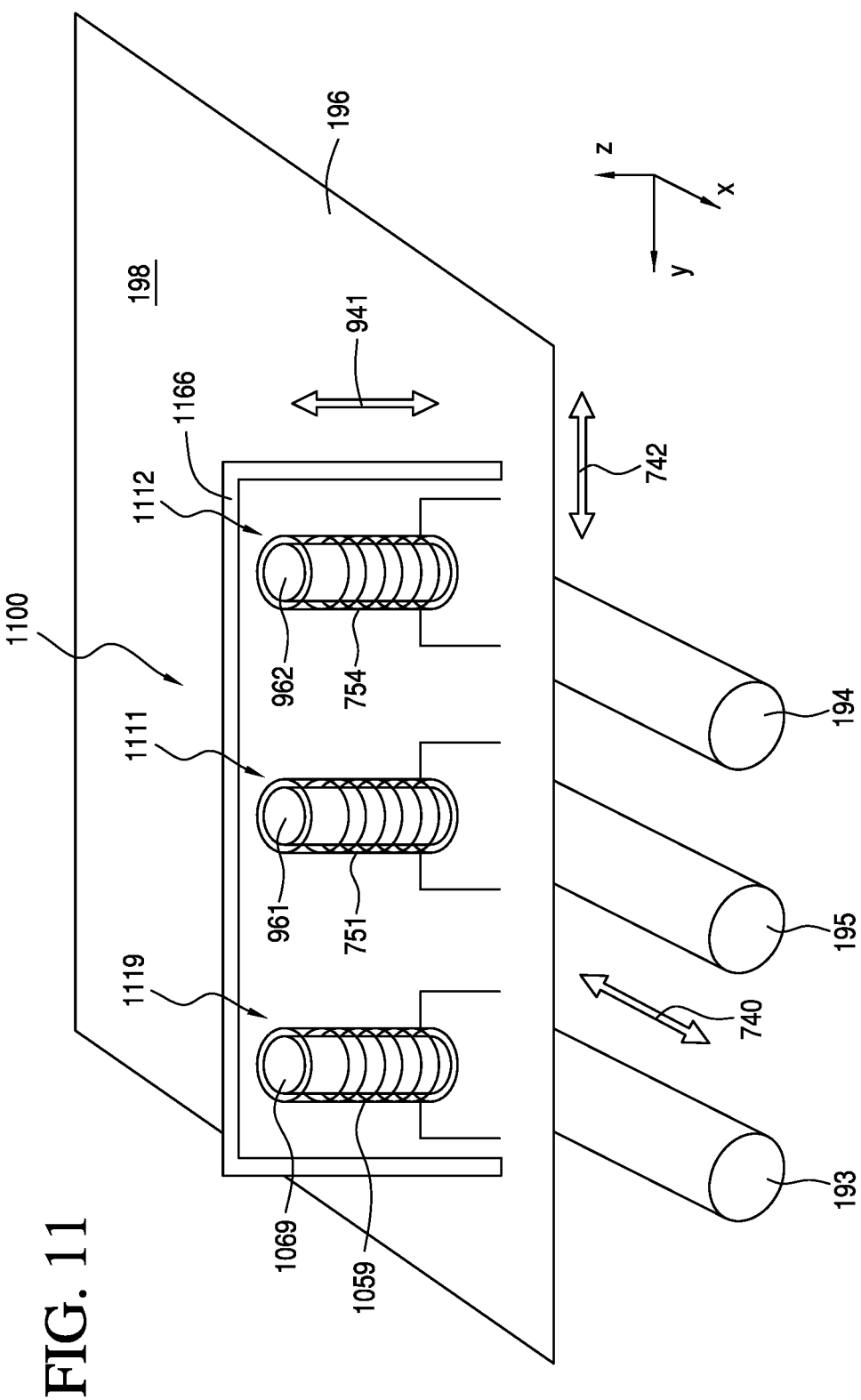
FIG. 11 illustrates exemplary magnetic field sensors of an electrical power monitoring system located on a surface of the electrical circuit breaker panel of FIG. 1, according to an embodiment different from FIGS. 7, 9, and 10.

FIG. 11 illustrates exemplary magnetic field sensors 1111, 1112, and 1119 of electrical power monitoring system 1100 located on surface 198 of panel 196, according to an embodiment. Electrical power monitoring system 1100 can also be considered a system for monitoring electrical power usage of a structure. Electrical power monitoring system 1100 is merely exemplary and is not limited to the embodiments presented herein. Electrical power monitoring system 1100 can be employed in many different embodiments or examples not specifically depicted or described herein.

Electrical power monitoring system 1100 can be similar or the same as electrical power monitoring system 1000 except that ferromagnetic domes 1066, 1067, and 1068 are replaced by a single ferromagnetic dome 1166 enclosing coiled conductors 751, 754, and 1059. In some examples, using one ferromagnetic dome instead of individual ferromagnetic domes over each of the coiled conductors can decrease the cost of the electrical power monitoring system.

Figure 12:
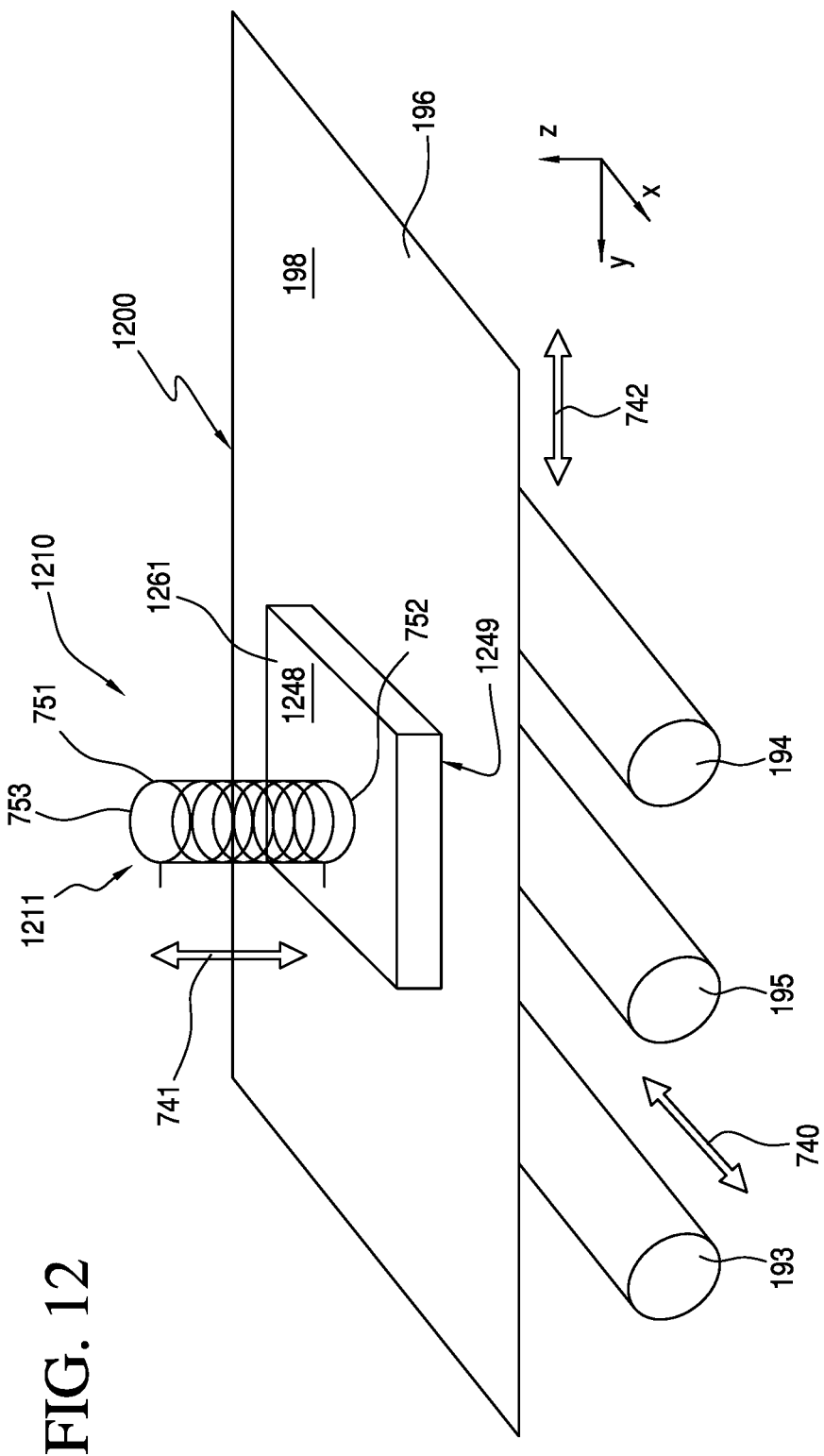
FIG. 12 illustrates an exemplary magnetic field sensors of an electrical power monitoring system located on a surface of the electrical circuit breaker panel of FIG. 1, according to an embodiment different from FIGS. 7 and 9-11.

FIG. 12 illustrates an exemplary magnetic field sensors 1211 of electrical power monitoring system 1200 located on surface 198 of panel 196, according to an embodiment. Electrical power monitoring system 1200 can also be considered a system for monitoring electrical power usage of a structure. Electrical power monitoring system 1200 is merely exemplary and is not limited to the embodiments presented herein. Electrical power monitoring system 1200 can be employed in many different embodiments or examples not specifically depicted or described herein.

In some examples, electrical power monitoring system 1200 can include: (a) a sensing device 1210; (b) a computational unit 120 (FIGS. 1 and 2); (c) a display device 130 (FIGS. 1 and 2); and (d) a calibration unit 180 (FIGS. 1 and 2). Sensing device 1210 can include: (a) at least one electrical current sensor or magnetic field sensor 1211; (b) magnet 1261; (c) a controller 213 (FIG. 2); (d) a user communications module 214 (FIG. 2); (e) a transceiver 215 (FIG. 2); (f) a power source 216 (FIG. 2); and (g) a coupling mechanism 219 (FIG. 2). Magnet 1261 can be considered part of or coupled to magnetic field sensors 1211. In some examples, magnet 1261 is configured to magnetically couple sensing device 1210 to panel 196.

In many examples, magnetic field sensors 1211 can include coiled conductors (e.g., coiled wires). In many embodiments, magnetic field sensor 1211 can include a coiled conductor 751. In some examples, coiled conductor 751 can be coiled in a first direction 743 (e.g., counter-clockwise). In the embodiment shown in FIG. 12, axis 741 is substantially perpendicular to axes 740 and 742. That is, the length of coiled conductor 751 running from first end 752 to second end 753 can be substantially perpendicular to surface 198 and main electrical power lines 193, 194, and 195.

Magnet 1261 can have a first side 1248 and a second side 1249 opposite the first side 1248. Second side 1249 can be adjacent to surface 198 of panel 196. In some examples, first end 752 of coiled conductor 751 can be coupled to or adjacent to first side 1248 of magnet 1261. Second end 753 can be spaced apart from first side 1248 of magnet 1261.

In some examples, magnet 1261 can help equalize the reactance of coiled conductor 751 and panel 196 as seen by main electrical power lines 193, 194, and 195 by saturating the magnetic field in the region of panel 196 near coiled conductor 751. Thus, the reactance of coiled conductor 751 and panel 196 as seen by main electrical power lines 193, 194, and 195 is substantially constant and the non-linearity of the magnetic filed caused by panel 196 is eliminated.

Figure 13:
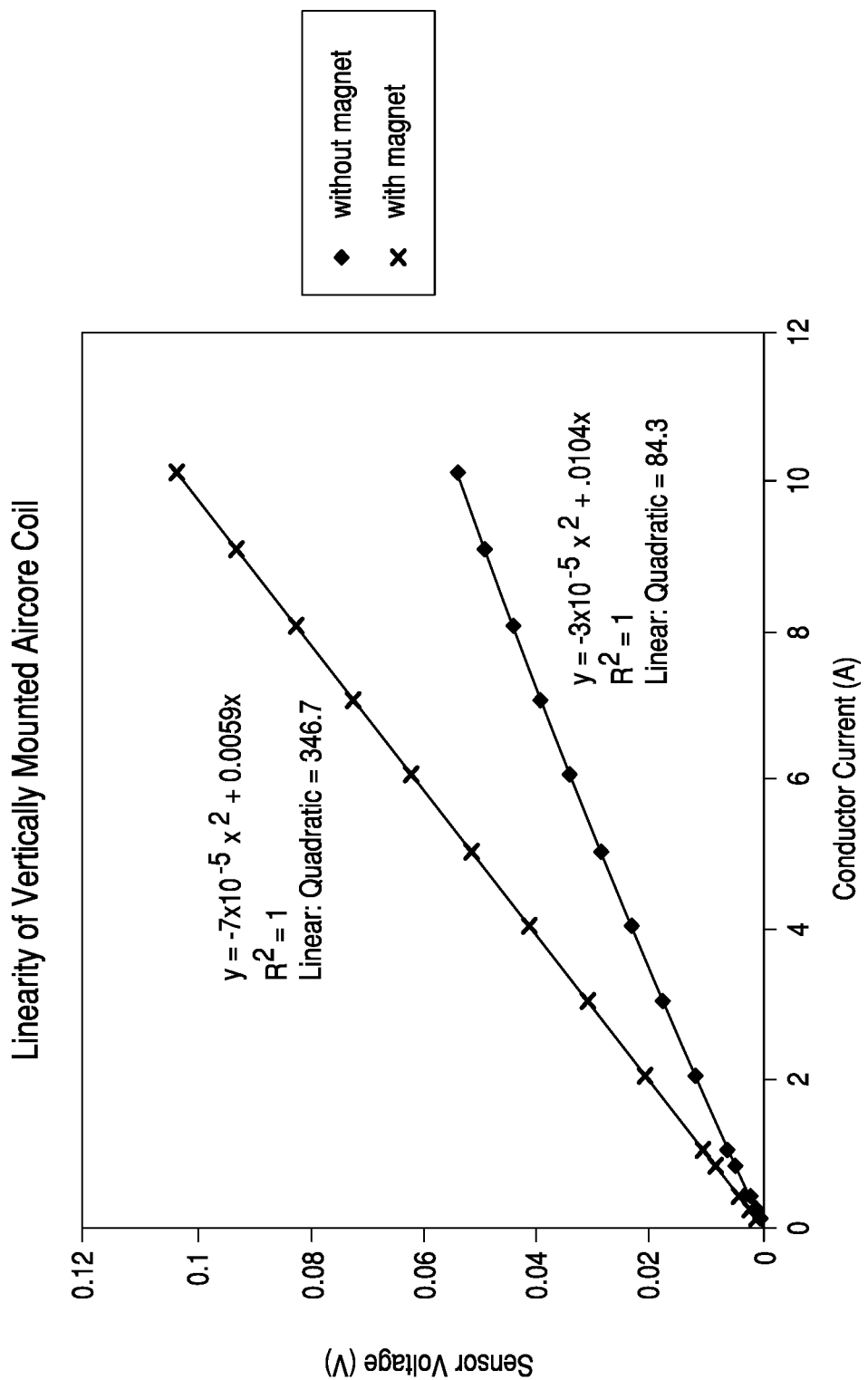
FIG. 13 is a graph illustrating the induced voltage versus conductor current for an exemplary electrical circuit breaker panel with a metal panel overlying the main electrical power lines, according to an embodiment.

FIG. 13 is a graph 1300 illustrating an induced voltage versus a conductor current for an exemplary electrical circuit breaker panel with a metal panel overlying the main electrical power lines, according to an embodiment. That is, graph 1300 illustrates the induced voltage versus the conductor current for a sensing device substantially similar to sensing device 1210 and a sensing device substantially similar to sensing device 1210 but without magnet 1261. As illustrated in FIG. 13, the use of magnet 1261 in sensing device 1210 greatly increases the linearity of the induced voltage.

Figure 14:
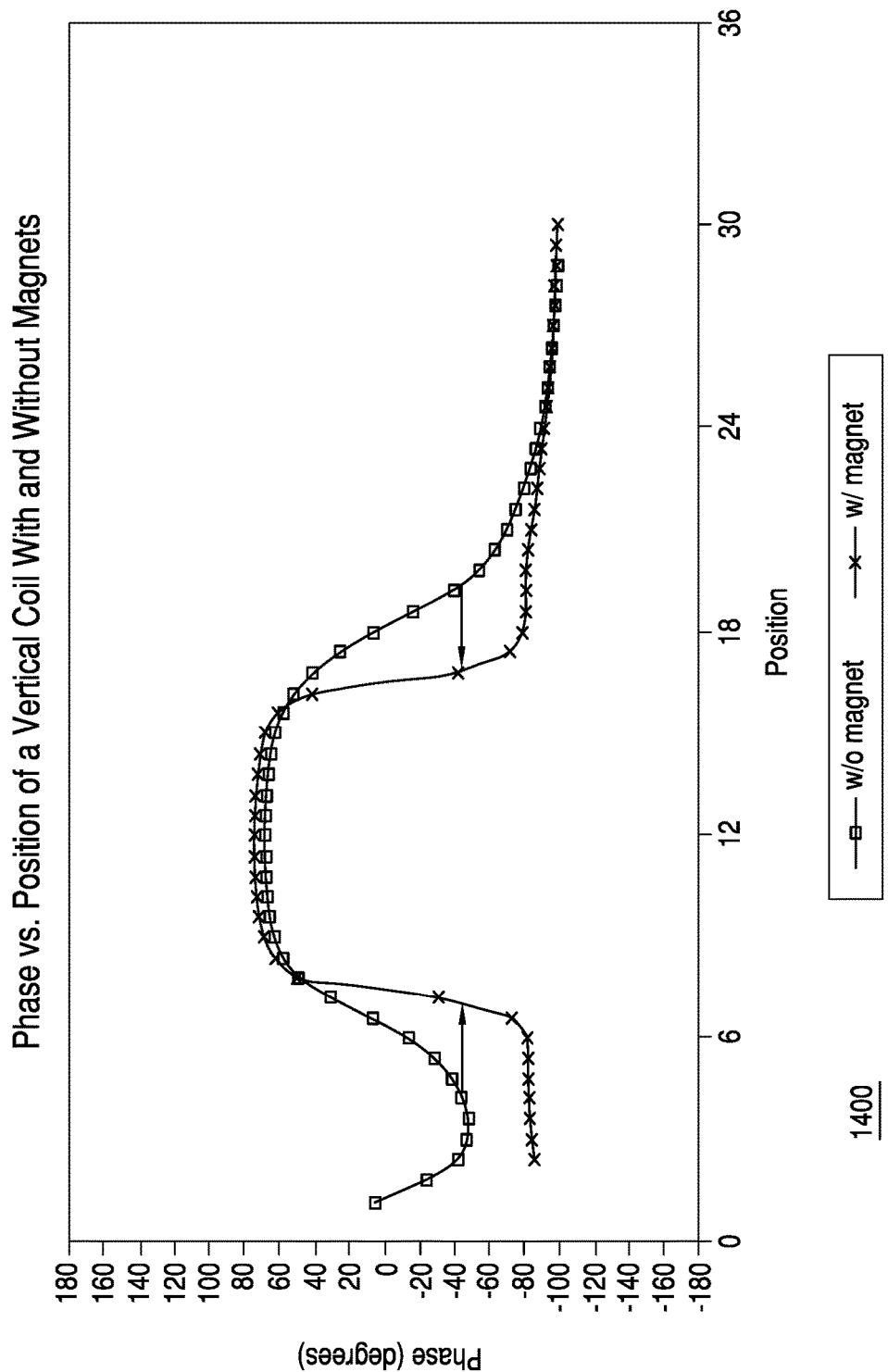
FIG. 14 is a graph illustrating a phase angle of a received sign relative to the voltage versus a position measured using the electrical power monitoring system of FIG. 12, according an embodiment.

Similarly, FIG. 14 is a graph 1400 illustrating a phase angle of a received signal (relative to the voltage) versus the position, according an embodiment. To create graph 1400, a fixed current was placed in main electrical power lines 193, 194, and 195 and a sensing device was moved in approximately 0.6 centimeter increments relative to main electrical power lines 193, 194, and 195 while the phase angle of the received signal relative to the voltage was measured. Graph 1400 illustrates the induced voltage versus position for sensing device substantially similar to sensing device 1210 and a sensing device substantially similar to sensing device 1210 but without magnet 1261. As shown in FIG. 14, the phase angle exhibits a much sharper phase angle shift when a sensing device 1210 with magnet 1261 is used. In the region where the phase angle is shifting, it is difficult to measure the phase angle and thus current measurements in these areas can have a higher error rate. By increasing the sharpness of the phase angle shift, the area at which sensing device 1210 provides useable results is greatly increased.

Figure 15:
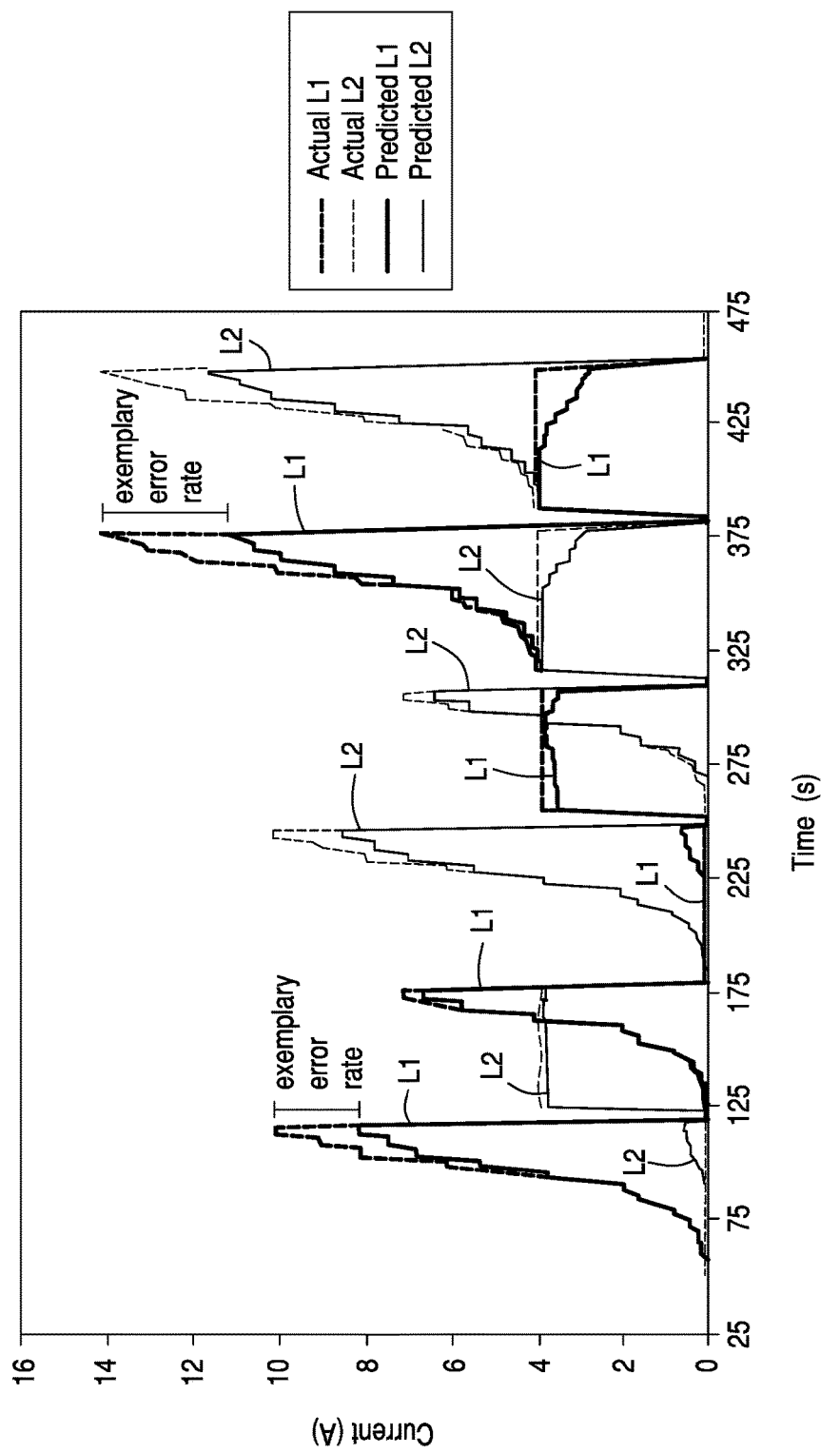
FIG. 15 illustrates a graph showing the actual and predicted current measurements of an electrical power monitoring system with a vertically mounted coiled conductor but without a magnet, according to an embodiment.
Figure 16:
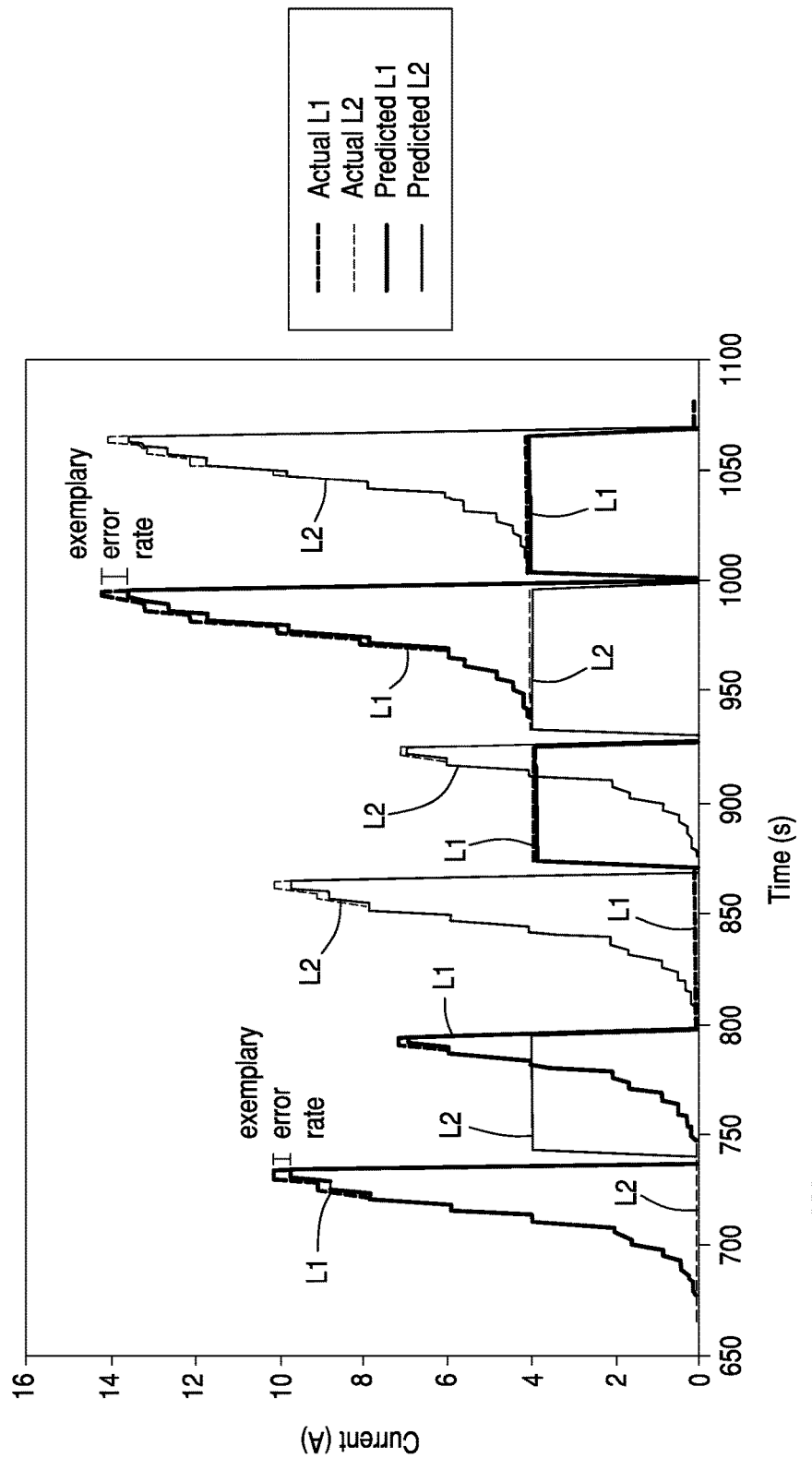
FIG. 16 illustrates a graph showing the actual and predicted current measurements of the electrical power monitoring system of FIG. 12, according to an embodiment.

FIGS. 15 and 16 illustrate the results of two additional test scenarios that show the improved accuracy of electrical power monitoring system 1200 compared to an electrical power monitoring system without a magnet. FIG. 15 illustrates a graph 1500 showing the result of using an electrical power monitoring system with a vertically mounted coiled conductor but without a magnet, according to an embodiment. FIG. 16 illustrates a graph 1600 showing the result of using an electrical power monitoring system 1200 (i.e., a vertically mounted coiled conductor with a magnet), according to an embodiment. FIGS. 15 and 16 show the current measured in each of the electrical phase lines (L1 and L2) by the electrical power monitoring system and the actual current in main electrical power lines 193 (i.e., L1) and main electrical power line 195 (i.e., L2). As shown in FIGS. 15 and 16, use of a magnet as part of the electrical power monitoring system can dramatically decrease the error in the measured current rate. Tests of electrical power monitoring systems 100, 900, 1000, 1100, 1700, and 1800 of FIGS. 1, 9, 10, 11, 17, and 18 show similar increases in linearity and decreases in the error in the measured currents.

Figure 17:
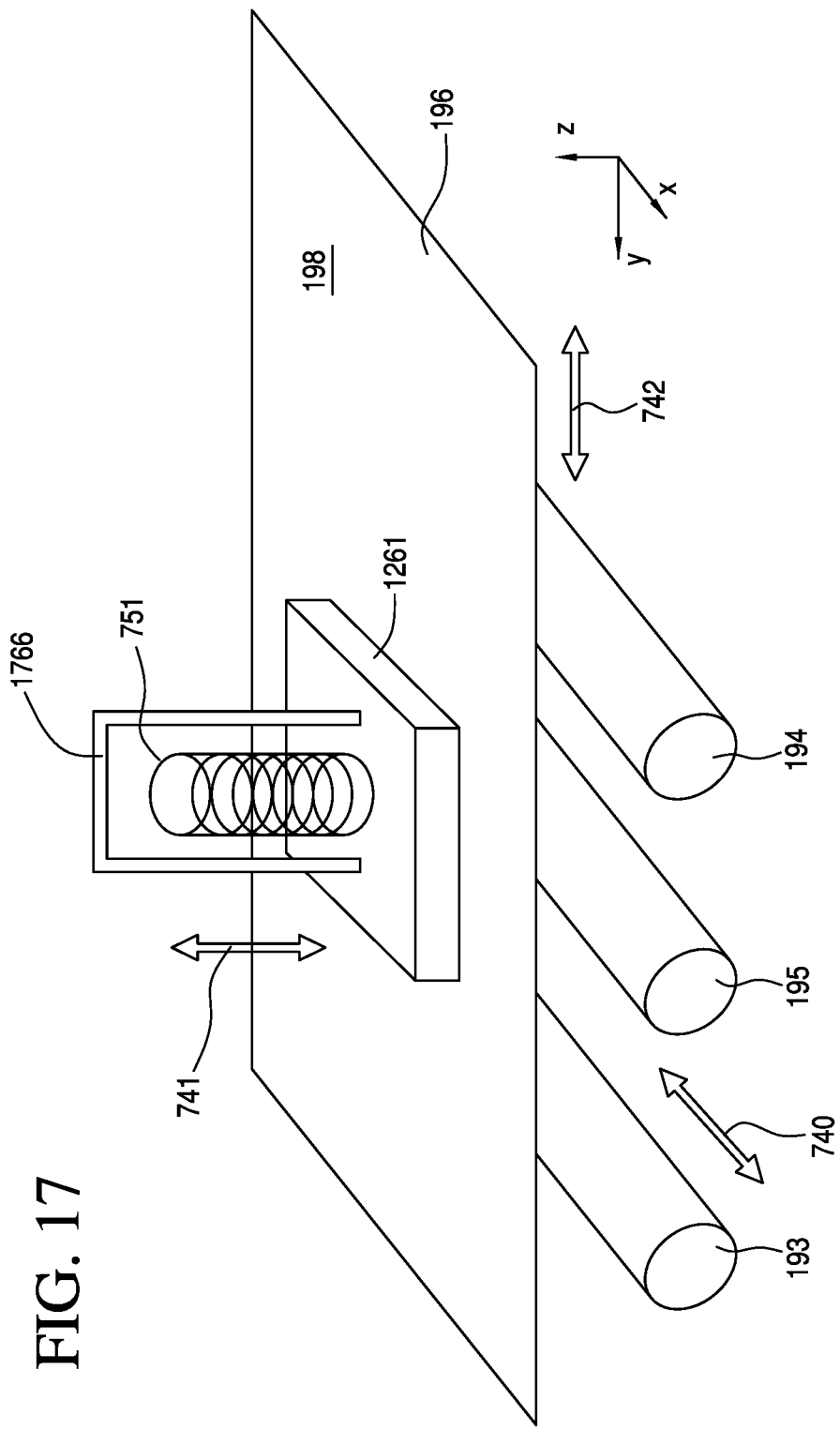
FIG. 17 illustrates an exemplary coiled conductor of an electrical power monitoring system located on a surface of the electrical circuit breaker panel of FIG. 1, according to an embodiment different from FIGS. 7 and 9-12.

FIG. 17 illustrates exemplary coiled conductor 751 of electrical power monitoring system 1700 located on surface 198 of panel 196, according to an embodiment. Electrical power monitoring system 1700 can also be considered a system for monitoring electrical power usage of a structure. Electrical power monitoring system 1700 is merely exemplary and is not limited to the embodiments presented herein. Electrical power monitoring system 1700 can be employed in many different embodiments or examples not specifically depicted or described herein.

Electrical power monitoring system 1700 can be similar or the same as electrical power monitoring system 1200 except electrical power monitoring system 1700 include a ferromagnetic dome 1766 over coiled conductor 751. In some examples, the ends of dome 1766 are located at magnet 1261. In other examples, magnet 1261 is also enclosed by dome 1766. In some examples, the use of dome 1766 in electrical power monitoring system 1200 can focus the magnetic flux lines in the region around and/or below coiled conductor 751.

Figure 18:
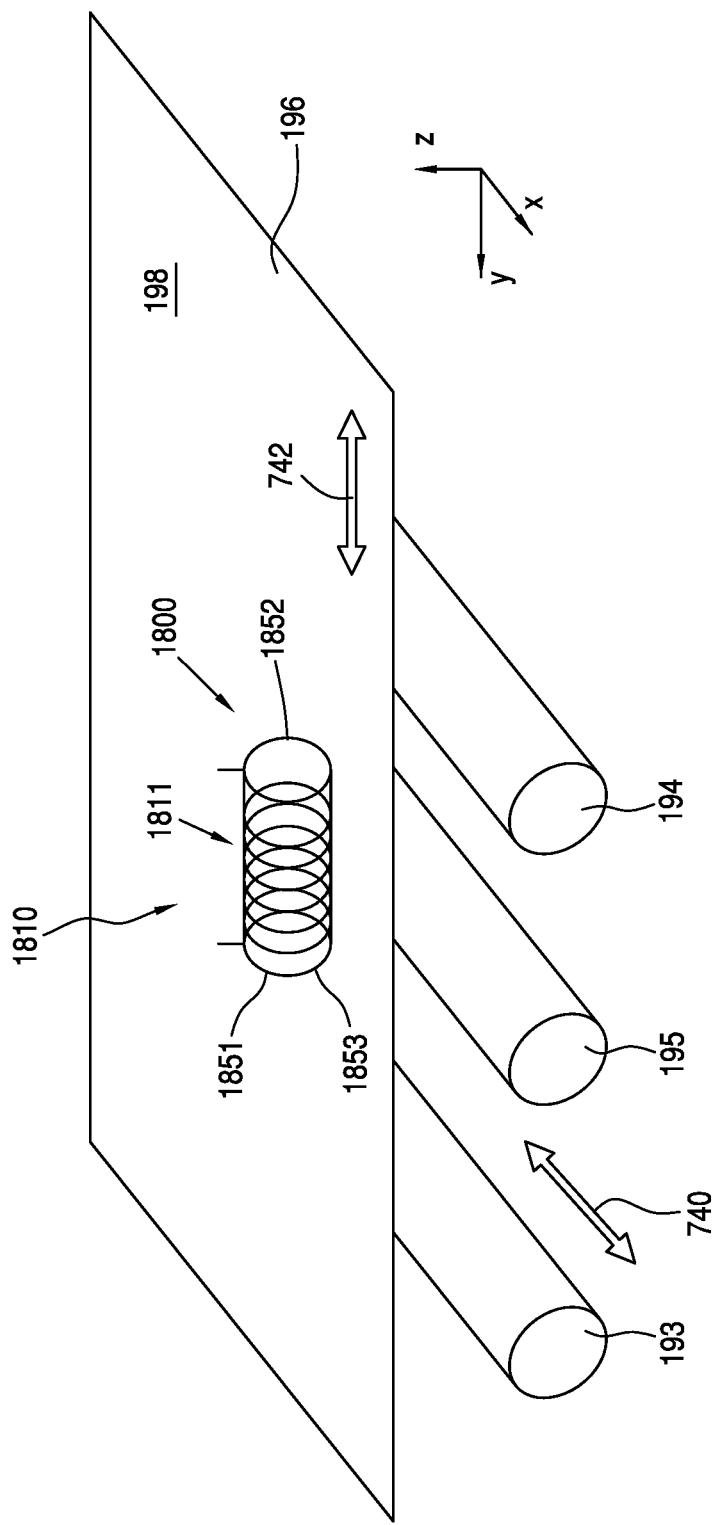
FIG. 18 illustrates an exemplary magnetic field sensor of an electrical power monitoring system located on a surface of panel of the electrical circuit breaker panel of FIG. 1, according to an embodiment different from FIGS. 7, 9-12, and 17.

FIG. 18 illustrates exemplary magnetic field sensor 1811 of electrical power monitoring system 1800 located on surface 198 of panel 196 with main electrical power lines 193, 194, and 195 under panel 196, according to an embodiment. Electrical power monitoring system 1800 can also be considered a system for monitoring electrical power usage of a structure. Electrical power monitoring system 1800 is merely exemplary and is not limited to the embodiments presented herein. Electrical power monitoring system 1800 can be employed in many different embodiments or examples not specifically depicted or described herein.

In some examples, electrical power monitoring system 1800 can include: (a) a sensing device 1810; (b) a computational unit 120 (FIGS. 1 and 2); (c) a display device 130 (FIGS. 1 and 2); and (d) a calibration unit 180 (FIGS. 1 and 2). Sensing device 1810 can include: (a) at least one electrical current sensor or magnetic field sensor 1811; (b) a controller 213 (FIG. 2); (c) a user communications module 214 (FIG. 2); (d) a transceiver 215 (FIG. 2); (e) a power source 216 (FIG. 2); and (f) a coupling mechanism 219 (FIG. 2).

In many embodiments, magnetic field sensor 1811 can include a coiled conductor 1851 with a first end 1852 and a second end 1853 opposite the first end 1852. In the embodiment shown in FIG. 18, a length of coiled conductor 1851 from end 1852 to 1853 can be substantially perpendicular to axis 742. That is, coiled conductor 1851 can be substantially perpendicular to main electrical power lines 193, 194, and 195 and substantially parallel to surface 198. When magnetic field sensors are placed in the configuration shown in FIG. 18, main electrical power lines 193, 194, and 195 see a substantially constant reactance from panel 196 and coiled conductor 951.

Figure 19:
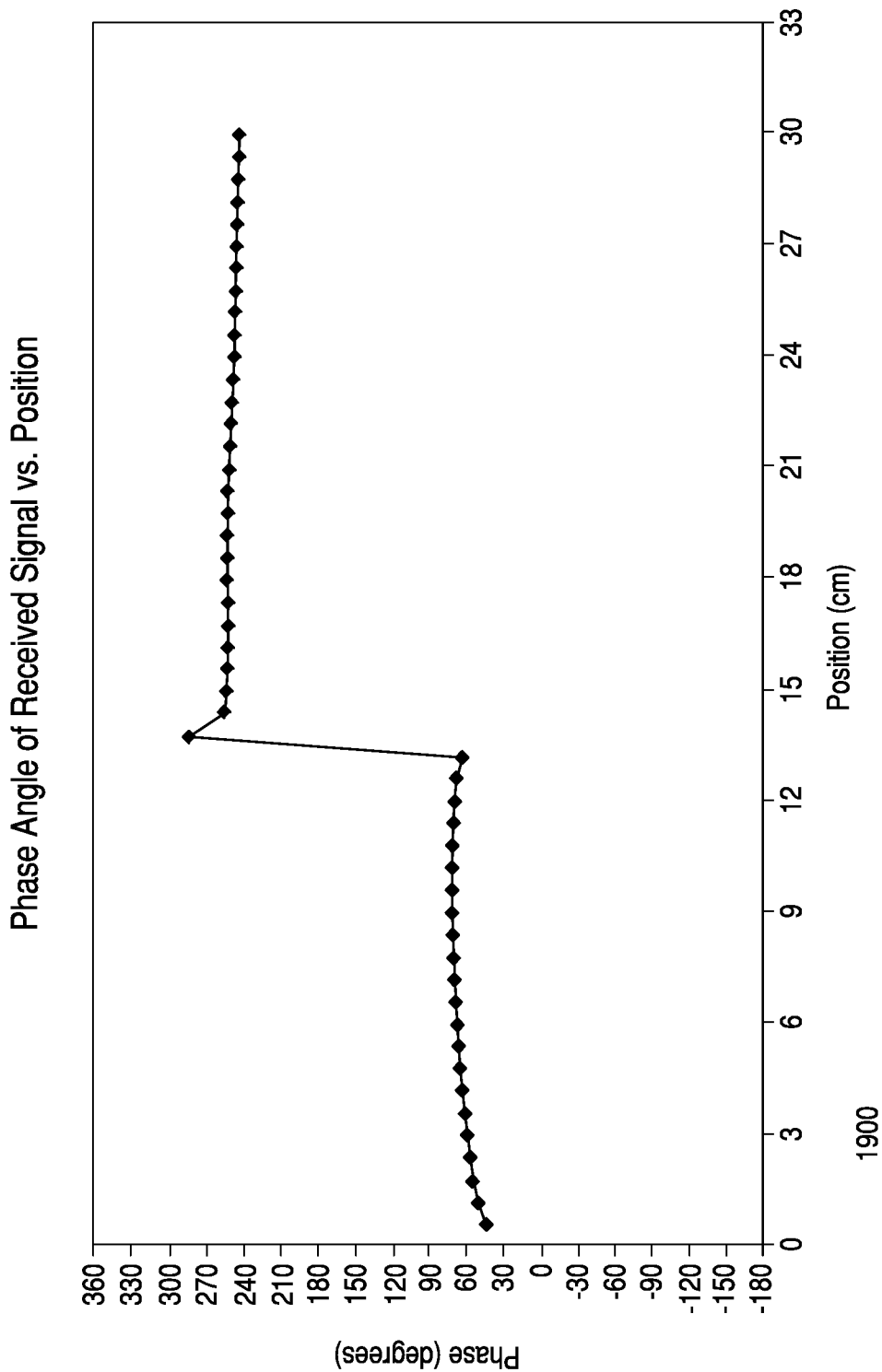
FIG. 19 is a graph illustrating phase angle of a received sign relative to the voltage versus position measured using the electrical power monitoring system of FIG. 18, according an embodiment.

FIG. 19 is a graph 1900 illustrating a phase angle of a received sign relative to the voltage versus a position of magnetic filed sensor 1811, according an embodiment. To create graph 1900, a fixed current was placed in main electrical power lines 193, 194, and 195 and coil conductor 1851 was moved in approximately 0.6 centimeter increments relative to main electrical power lines 193, 194, and 195 while the phase angle of the received signal relative to the voltage was measured. As shown in FIG. 19, the phase angle exhibits bistable behavior with has two different phases approximately 180° apart. The 180° phase shift occurs when the coil passes over the center of main electrical power line 195. Thus, reactance of coil conductor 1851 and panel 196 as seen by main electrical power lines 193, 194, and 195 is substantially constant and the non-linearity of the magnetic filed caused by panel 196 is eliminated.

Figure 20:
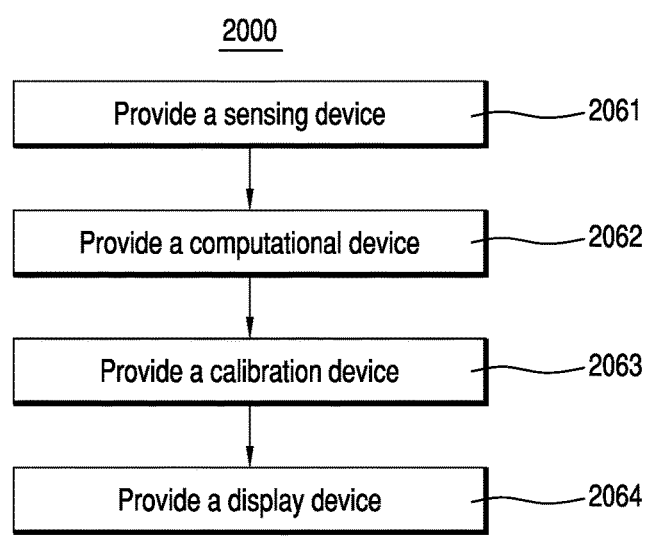
FIG. 20 illustrates a flow chart for an embodiment of a method of providing a system for monitoring electrical power usage of a structure, according to an embodiment.

FIG. 20 illustrates a flow chart for an embodiment of a method 2000 of providing a system for monitoring electrical power usage of a structure. Method 2000 is merely exemplary and is not limited to the embodiments presented herein. Method 2000 can be employed in many different embodiments or examples not specifically depicted or described herein. In some embodiments, the activities, the procedures, and/or the processes of method 2000 can be performed in the order presented. In other embodiments, the activities, the procedures, and/or the processes of the method 2000 can be performed in any other suitable order. In still other embodiments, one or more of the activities, the procedures, and/or the processes in method 2000 can be combined or skipped.

Referring to FIG. 20, method 2000 includes an activity 2061 of providing a sensing device. As an example, the sensing device can be similar or identical sensing devices 110, 910, 1010, 1210, and 1810 of FIGS. 1, 9, 10, 12, and 18, respectively.

Figure 21:
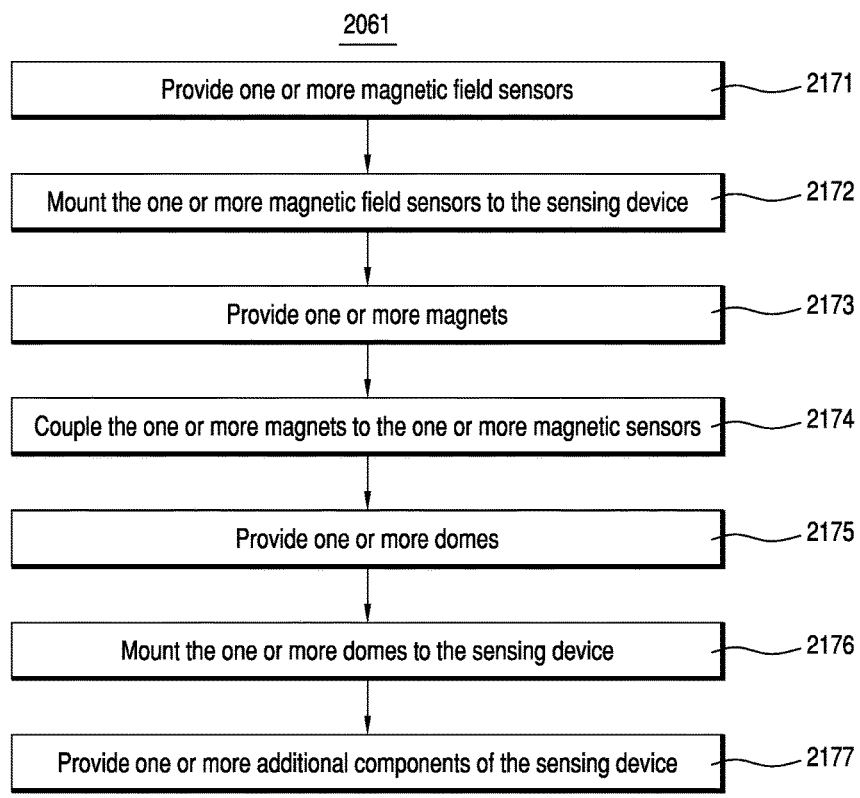
FIG. 21 illustrates a flow chart for an embodiment of an activity of providing a sensing device, according to the embodiment of FIG. 20.

In some examples, the sensing device can be configured to be coupled to a surface of the panel of an electrical breaker box. The sensing device can be configured to produce an output signal based on the magnetic field generated by one or more main electrical power lines in the electrical breaker box. FIG. 21 illustrates a flow chart for an embodiment of activity 2061 of providing a sensing device, according to the first embodiment.

Referring to FIG. 21, activity 2061 includes a procedure 2171 of providing one or more magnetic field sensors. In some examples, the magnetic filed sensors can be similar to magnetic field sensors 211 and 212 of FIG. 2, magnetic field sensors 911 and 912 of FIG. 9, magnetic field sensor 1011, 1012, 1019 of FIG. 10, magnetic field sensor 1211 of FIG. 12, and/or magnetic field sensor 1811 of FIG. 18. In some examples, the one or more magnetic field sensors can include one or more coiled conductors.

Next, activity 2061 of FIG. 21 includes a procedure 2172 of mounting the one or more magnetic field sensors to the sensing device. In some examples, procedure 2172 can include mounting the one or more magnetic field sensors at the sensing device such that an axis of the one or more magnetic field sensors are substantially perpendicular to a least a portion of one or more main electrical power lines and substantially parallel to the surface of the panel when the sensing device is coupled to the surface of the panel.

In other examples, procedure 2172 can include mounting the one or more magnetic field sensors at the sensing device such that an axis of the one or more magnetic field sensors are substantially perpendicular to a least a portion of one or more main electrical power lines and substantially perpendicular the surface of the panel when the sensing device is coupled to the surface of the panel. In various examples, the one or more magnetic field sensors at the sensing device are mounted such that an axis of the one or more magnetic field sensors are substantially perpendicular to a portion of one or more main electrical power lines directly below the magnetic field sensors and substantially perpendicular the surface of the panel when the sensing device is coupled to the surface of the panel Activity 2061 in FIG. 21 continues with a procedure 2173 of providing one or more magnets. As an example, the one or more magnets can be similar to magnetic cores 961 and 964 of FIG. 9, magnetic core 1069 of FIG. 10, and/or magnet 1261 of FIG. 12.

Subsequently, activity 2061 of FIG. 21 includes a procedure 2174 of coupling the one or more magnets to the one or more magnetic sensors. In some examples, coupling one or more magnetic sensors to the one or more magnets can include wrapping the one or more coiled conductors of the magnetic fields sensors around the one or more magnets. For example, the coiled conductors of the magnetic fields sensors can be wrapped around the one or more magnets can be similar to the coiled conductors wrapped around the one or more magnets as shown in FIGS. 9, 10, and/or 11.

In other embodiments coupling one or more magnetic sensors to the one or more magnets can include coupling one end of the magnetic field sensor to the one or more magnets. For example, coupling one end of the magnetic fields sensors to the one or more magnets can be similar to the coupling one end of the magnetic fields sensors to the one or more magnets as shown in FIGS. 12, and/or 13. In alternative examples, activity 2061 does not include procedures 2173 and 2174.

Next, activity 2061 of FIG. 21 includes a procedure 2175 of providing one or more ferromagnetic domes. As an example, the one or more ferromagnetic domes can be similar to domes 1066, 1067, and 1068 of FIG. 10, dome 1166 of FIG. 11 and/or dome 1766 of FIG. 16.

Activity 2061 in FIG. 21 continues with a procedure 2176 of mounting the one or more ferromagnetic domes such that the one or more magnetic field sensors are located within the one or more domes. For example, the one or more magnetic field sensors located within the one or more domes can be similar to the one or more magnetic field sensors located within the one or more domes as shown in FIGS. 10, 11, and/or 16. In alternative examples, activity 2061 does not include procedures 2175 and 2176.

Subsequently, activity 2061 of FIG. 21 includes a procedure 2177 of providing one or more additional components of the sensing device. In some examples, the one or more additional components can include a controller, a power source, a transceiver, a user communications module, and/or a coupling mechanism. After procedure 2174, activity 2061 is complete.

Referring again to FIG. 20, method 2000 in FIG. 20 continues with an activity 2062 of providing a computational device. As an example, the computational device can be similar or identical computational unit 120 of FIGS. 1 and 2. In some examples, activity 2062 can, instead, include just providing a processing unit. As an example, the processing unit can be similar or identical processing unit 222 of FIG. 2. In some examples, the processing unit can be configured to receive the output signal from the sensing device and further configured to process the output signal to determine one or more parameters related to the electrical power usage of the structure.

Subsequently, method 2000 of FIG. 20 includes an activity 2063 of providing a calibration device. As an example, the calibration device can be similar or identical calibration device 180 of FIGS. 1 and 2.

Subsequently, method 2000 of FIG. 20 includes an activity 2064 of providing a display device. As an example, the calibration device can be similar or identical display device 130 of FIGS. 1 and 2. In some examples, the display device can be part of computational unit 120.

Figure 22:
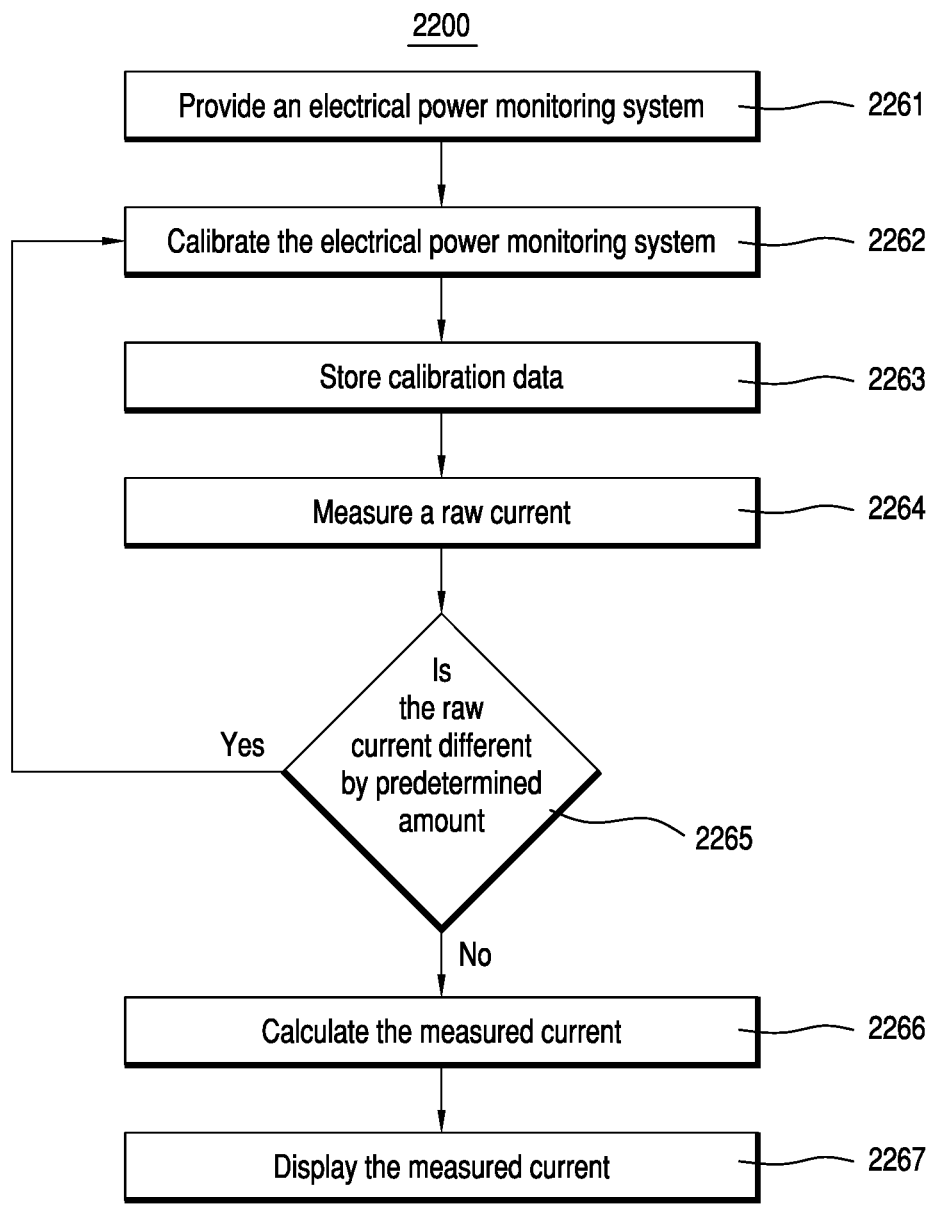
FIG. 22 illustrates a flow chart for an embodiment of a method of using a system for monitoring electrical power usage of a structure, according to an embodiment.

In addition to mitigating the non-linearity of the magnetic field by changing the configuration of the sensing device, the non-linearity of the magnetic field can be mitigated by modifying the method of calibrating and using the electrical power monitoring system. FIG. 22 illustrates a flow chart for an embodiment of a method 2200 of using a system for monitoring electrical power usage of a first load of a structure. Method 2200 is merely exemplary and is not limited to the embodiments presented herein. Method 2200 can be employed in many different embodiments or examples not specifically depicted or described herein. In some embodiments, the activities, the procedures, and/or the processes of method 2200 can be performed in the order presented. In other embodiments, the activities, the procedures, and/or the processes of the method 2200 can be performed in any other suitable order. In still other embodiments, one or more of the activities, the procedures, and/or the processes in method 2200 can be combined or skipped.

Referring to FIG. 22, method 2200 includes an activity 2261 of providing an electrical power monitoring system. As an example, the electrical power monitoring system can be similar or identical to electrical power monitoring systems 100, 900, 1000, 1100, 1200, 1700, and 1800 of FIGS. 1, 9, 10, 11, 12, 17, and 18, respectively.

Method 2200 in FIG. 22 continues with an activity 2262 of calibrating the electrical power monitoring system. In some examples, a first calibration can be preformed when the electrical power monitoring system is first installed or powered-up. In some examples, a computational device of the electrical power monitoring system is plugged into a first phase line (e.g., L1) of the electrical power system of the structure and a calibration device of the electrical power monitoring system is plugged into a second phase line (e.g., L2) of the electrical power system of the structure.

In some examples, calibrating the electrical power monitoring system can first include determining a first amplitude and a first phase of a first current in each of the current sensors of the sensing device. Afterwards, a first load in the computational device is coupled to the first phase branch and a second amplitude and a second phase of a second current in each of the current sensors of the sensing device are determined. Next, a second predetermined load in the calibration device is coupled to the second phase branch and a third amplitude and a third phase of a third current in each of the current sensors are determined. Finally, one or more calibration factors are determined for the sensing device at least in part using the first amplitudes, the first phases, the second amplitudes, the second phases, the third amplitudes, and the third phases.

Subsequently, method 2200 of FIG. 22 includes an activity 2263 of storing the calibration data. In some examples, the calibration data can include the calibration factors and the first amplitude and the first phase of a first current. The calibration data can be stored in memory in the computational device.

Next, method 2200 of FIG. 22 includes an activity 2264 of measuring a raw current.

Method 2200 in FIG. 22 continues with an activity 2265 of determining if the raw current different by a predetermined amount from stored calibration data. If the current is within a predetermined amount of the current of the stored calibration data, the next activity is activity 2266 of calculating the measure current.

If the raw current is not with a predetermined amount (e.g., 1 percent (%), 5%, 10%, or 25%) of the first current, the next activity is activity 2262 of calibrating the electrical power monitoring system. The new calibration parameters and new first current can be stored in memory. Thus, a database of calibration data and raw currents can be created. Thus, in activity 2265, the raw current can be compared to all of the calibration data stored in the memory. If the raw current is not within a predetermined amount of the stored calibration data, the electrical power monitoring system can be recalibrated. That is, a new calibration would occur anytime electrical power monitoring system detects that a large change in the current has occurred from previously measured currents. Thus, the non-linearity in the magnetic field can be mitigated by re-calibrating the electrical power monitoring system anytime a large change in the current of the main electrical power lines occurs.

Subsequently, method 2200 of FIG. 22 includes an activity 2266 of calculating the measured current using the stored calibration data.

Afterwards, method 2200 continues with an activity 2267 of displaying the measured current. In some examples, the measured current can be displayed using display device 130.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that activities 2061, 2062, 2063, and 2064 of FIG. 20, procedures 2171, 2172, 2173, 2174, 2175, 2176, and 2177 of FIG. 20, and activities 2261, 2262, 2263, 2264, 2265, 2266, 2267 of FIG. 22 may be comprised of many different activities, procedures and be performed by many different modules, in many different orders that any element of FIGS. 1, 2, 7, 9, 10, 11, 12, 17, and 18 may be modified and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method for monitoring usage of electrical power of a structure using an electrical power monitoring system, the structure having one or more main electrical power lines that supply the electrical power to a first load in the structure, the method comprising:
   calibrating the electrical power monitoring system, comprising:
      attaching a computational device of the electrical power monitoring system to a first phase line of the structure;
      attaching a calibration device of the electrical power monitoring system to a second phase line of the structure, wherein the first phase line of the structure is different than the second phase line of the structure; and
      determining amplitudes and phases of currents in each current sensor of a sensing device of the electrical power monitoring system while the computational device is attached to the first phase line and while the calibration device is attached to the second phase line, wherein first calibration data are generated while calibrating the electrical power monitoring system;
   storing the first calibration data;
   measuring a first raw current using the sensing device of the electrical power monitoring system;
   calculating a first measured current based on the first raw current; and
   displaying the first measured current.

2. The method of claim 1, wherein calculating the first measured current comprises:
   if the first raw current is not within a first predetermined amount of at least one of the currents, performing a first recalibration of the electrical power monitoring system comprising:
      calibrating the electrical power monitoring system, wherein second calibration data is generated while performing the first recalibration of the electrical power monitoring system;
      storing the second calibration data; and
      calculating the first measured current using the second calibration data; and
   if the first raw current is within the first predetermined amount of at least one of the currents, calculating the first measured current using the first calibration data.

3. The method of claim 2, wherein the first predetermined amount is approximately 1 percent.

4. The method of claim 2, wherein the first predetermined amount is approximately 5 percent.

5. The method of claim 2, wherein the first predetermined amount is approximately 10 percent.

6. The method of claim 2, wherein the first predetermined amount is approximately 25 percent.

7. The method of claim 2 further comprising:
   measuring a second raw current;

calculating a second measured current based on the second raw current; and displaying the second measured current.

8. The method of claim 7, wherein displaying the first and second measured currents comprises:

displaying the first and second measured currents on a display device.

9. The method of claim 7, wherein calculating the second measured current comprises:

if the second raw current is not within a second predetermined amount of at least one of the currents, performing a second recalibration of the electrical power monitoring system comprising:

calibrating the electrical power monitoring system, wherein third calibration data are generated while performing the second recalibration of the electrical power monitoring system;

storing the third calibration data; and calculating the second measured current using the third calibration data; and if the second raw current is within the second predetermined amount of at least one of the currents or the first raw current, calculating the second measured current using the first calibration data or the second calibration data.

10. The method of claim 9, wherein the second predetermined amount is approximately 1 percent.

11. The method of claim 9, wherein the second predetermined amount is approximately 5 percent.

12. The method of claim 9, wherein the second predetermined amount is approximately 10 percent.

13. The method of claim 9, wherein the second predetermined amount is approximately 25 percent.

14. The method of claim 1, wherein determining the amplitudes and phases of the currents in the each current sensor of the sensing device comprises:

determining a first amplitude and a first phase of a first current in each of the current sensors of the sensing device of the electrical power monitoring system while the computational device is attached into the first phase line and while the calibration device is attached into the second phase line, wherein:

the currents comprise the first currents of the current sensors;

the amplitudes comprise the first amplitudes of the current sensors;

the phases comprise the first phases of the current sensors; and the first amplitudes and the first phases of the first currents of the current sensors are determined while a first load and a second load of the computational device are devoid of being coupled to the first phase line.

15. The method of claim 14, wherein determining the amplitudes and phases of the currents in the each current sensor of the sensing device comprises:

coupling the first load of the computational device to the first phase line.

16. The method of claim 15, wherein:

determining the amplitudes and phases of the currents in the each current sensor of the sensing device comprises:

determining, while the first load of the computational device is coupled to the first phase line, a second amplitude and a second phase of a second current in each of the current sensors of the sensing device of the electrical power monitoring system, the currents comprising the second currents of the current sensors, the amplitudes comprising the second amplitudes of the current sensors, and the phases comprising the second phases of the current sensors.

17. The method of claim 16, wherein determining amplitudes and phases of the currents in the each current sensor of the sensing device comprises:

coupling a second load of the calibration device to the second phase line; and determining, while the second load is coupled to the second phase line, a third amplitude and a third phase of a third current in each of the current sensors of the sensing device of the electrical power monitoring system, the currents comprising the third currents of the current sensors, the amplitudes comprising the third amplitudes of the current sensors, and the phases comprising the third phases of the current sensors.

18. The method of claim 17, wherein calibrating the electrical power monitoring system further comprises:

determining the first calibration data based at least in part on the first amplitudes, the first phases, the second amplitudes, the second phases, the third amplitudes, and the third phases of the current sensors of the sensing device of the electrical power monitoring system.

19. The method of claim 18, wherein calibrating the electrical power monitoring system further comprises:

determining the first calibration data further based at least in part on an amplitude of the first raw current and a phase of the first raw current.

20. The method of claim 19, wherein:

calculating the first measured current comprises:

if the first raw current is not within a first predetermined amount at least one of the currents, performing a first recalibration of the electrical power monitoring system comprising:

calibrating the electrical power monitoring system, wherein second calibration data is generated while performing the first recalibration of the electrical power monitoring system;

storing the second calibration data; and calculating the first measured current using the second calibration data; and if the first raw current is within the first predetermined amount of at least one of the currents, calculating the first measured current using the first calibration data;

the first predetermined amount is approximately 1 percent;

the method further comprises:

measuring a second raw current;

calculating a second measured current based on the second raw current; and displaying the second measured current;

displaying the first and second measured currents comprises:

displaying the first and second measured currents on a display device;

calculating the second measured current comprises:

if the second raw current is not within a second predetermined amount of at least one of the currents, performing a second recalibration of the electrical power monitoring system comprising:

calibrating the electrical power monitoring system, wherein third calibration data are generated while performing the second recalibration of the electrical power monitoring system;

storing the third calibration data; and
calculating the second measured current using the third calibration data; and
if the second raw current is within the second predetermined amount of at least one of the currents or the first raw current, calculating the second measured current using the first calibration data or the second calibration data; and
the second predetermined amount is approximately 1 percent.

* * * * *